United States Patent
Kuwahara

(10) Patent No.: US 10,395,968 B2
(45) Date of Patent: Aug. 27, 2019

(54) SUBSTRATE TRANSPORT DEVICE, DETECTION POSITION CALIBRATION METHOD AND SUBSTRATE PROCESSING APPARATUS

(71) Applicant: SCREEN Holdings Co., Ltd., Kyoto (JP)

(72) Inventor: Joji Kuwahara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/843,279

(22) Filed: Dec. 15, 2017

(65) Prior Publication Data

US 2018/0218935 A1 Aug. 2, 2018

(30) Foreign Application Priority Data

Jan. 27, 2017 (JP) .................................. 2017-012830

(51) Int. Cl.
*H01L 21/687* (2006.01)
*H01L 21/67* (2006.01)
(Continued)

(52) U.S. Cl.
CPC .... *H01L 21/68707* (2013.01); *H01L 21/6719* (2013.01); *H01L 21/67259* (2013.01);
(Continued)

(58) Field of Classification Search
CPC .................................................. H01L 21/67259
See application file for complete search history.

(56) References Cited

U.S. PATENT DOCUMENTS

2002/0089655 A1* 7/2002 Kida .................. G03F 7/70691
355/72
2004/0037690 A1* 2/2004 Kubo ..................... B25J 15/103
414/741
(Continued)

FOREIGN PATENT DOCUMENTS

JP 2014-22589 A 2/2014
TW 201409601 A 3/2014
(Continued)

OTHER PUBLICATIONS

Office Action dated Sep. 12, 2018 in counterpart Taiwanese Patent Application No. 106142495.

*Primary Examiner* — Thomas Randazzo
(74) *Attorney, Agent, or Firm* — Ostrolenk Faber LLP

(57) ABSTRACT

During a detection position calibrating operation and a substrate transport operation, a detection coordinate calculator calculates detection coordinates of an outer periphery of a reference substrate or a substrate placed at a reference position on a hand. During the detection position calibrating operation, an offset calculator calculates offsets of a plurality of detectors based on detection coordinates and design coordinates. During the substrate transport operation, a detection coordinate corrector corrects the detection coordinates based on the offsets of the plurality of detectors, and a coordinate information corrector corrects coordinate information based on the corrected detection coordinates. A movement controller controls an up-and-down direction driving motor, a horizontal direction driving motor and a rotation direction driving motor and controls an upper hand advancing retreating driving motor and a lower hand advancing retreating driving motor, such that the substrate is transported from a reception position to a placement position based on the corrected coordinate information.

11 Claims, 12 Drawing Sheets

(51) Int. Cl.
*H01L 21/677* (2006.01)
*H01L 21/68* (2006.01)

(52) U.S. Cl.
CPC .. *H01L 21/67766* (2013.01); *H01L 21/67781* (2013.01); *H01L 21/68* (2013.01); *H01L 21/681* (2013.01)

(56) References Cited

U.S. PATENT DOCUMENTS

| | | | |
|---|---|---|---|
| 2012/0268742 A1* | 10/2012 | Hatano | G01N 21/956 356/364 |
| 2013/0053997 A1* | 2/2013 | Ohashi | H01L 21/67742 700/103 |
| 2013/0084393 A1* | 4/2013 | Kashiyama | H01L 21/6715 427/273 |
| 2014/0023776 A1 | 1/2014 | Kuwahara et al. | 427/8 |
| 2015/0314314 A1* | 11/2015 | Kuwahara | B05C 13/00 427/8 |
| 2015/0318198 A1* | 11/2015 | Kuwahara | H01L 21/68 414/222.02 |
| 2016/0020125 A1* | 1/2016 | Kuwahara | H01L 21/67028 414/222.02 |
| 2017/0263483 A1 | 9/2017 | Kuwahara | |
| 2017/0301540 A1* | 10/2017 | Hashimoto | H01L 21/02 |
| 2018/0047603 A1 | 2/2018 | Kuwahara | |
| 2018/0211859 A1 | 7/2018 | Kuwahara | |

FOREIGN PATENT DOCUMENTS

| | | |
|---|---|---|
| TW | 201541544 A | 11/2015 |
| TW | 201541545 A | 11/2015 |
| TW | 201614761 A | 4/2016 |
| TW | 201622052 A | 6/2016 |

* cited by examiner

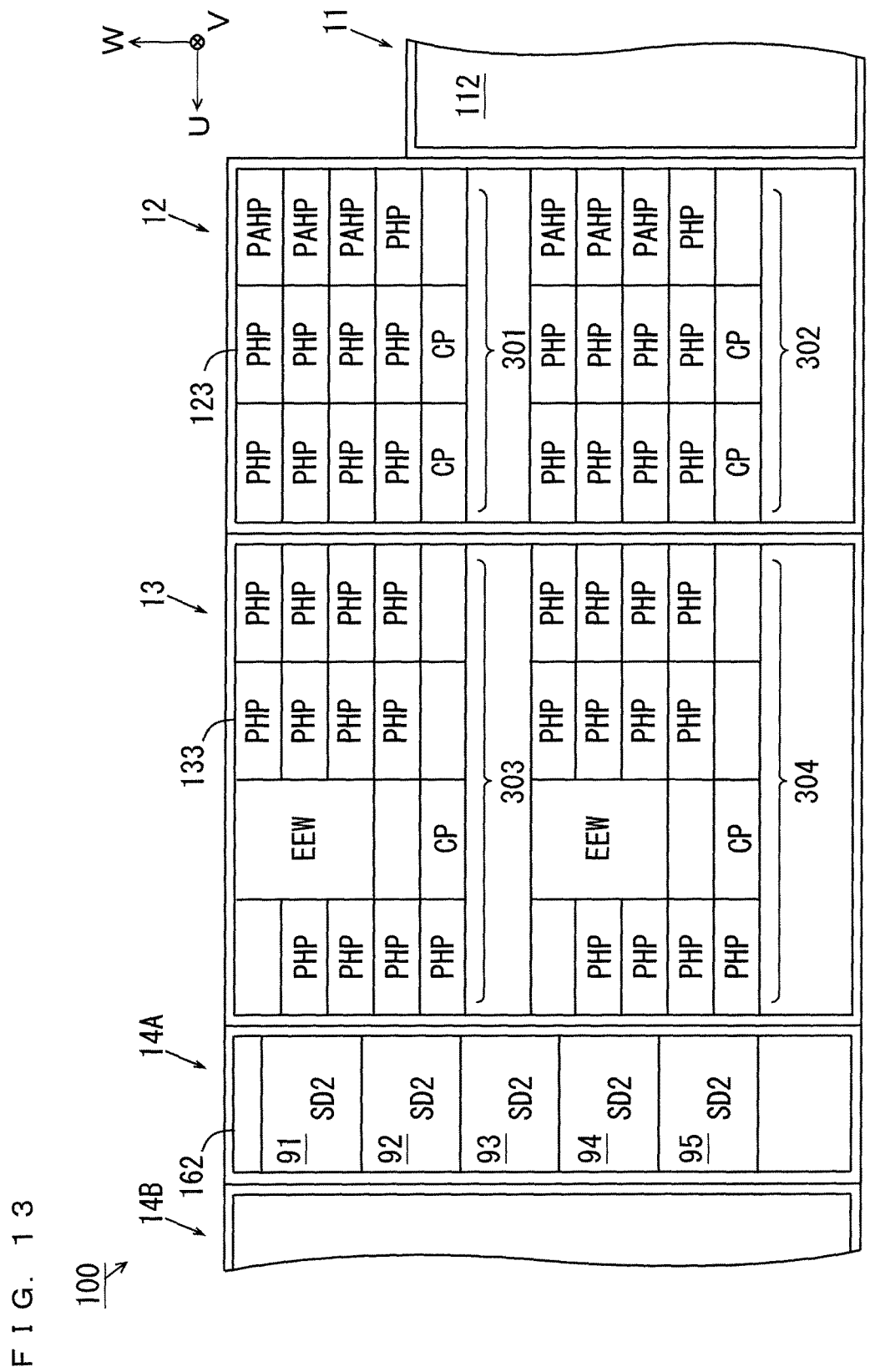

SUBSTRATE TRANSPORT DEVICE, DETECTION POSITION CALIBRATION METHOD AND SUBSTRATE PROCESSING APPARATUS

BACKGROUND OF THE INVENTION

Field of the Invention

The present invention relates to a substrate transport device that transports a substrate, a detection position calibration method for calibrating a detection position of the substrate in the substrate transport device, and a substrate processing apparatus.

Description of Related Art

Substrate processing apparatuses are used to subject substrates such as semiconductor substrates, substrates for liquid crystal display devices, substrates for plasma displays, substrates for optical discs, substrates for magnetic discs, substrates for magneto-optical discs, substrates for photomasks and other substrates to various types of processing.

Generally, in such a substrate processing apparatus, processing is successively performed on one substrate in a plurality of processing units. Therefore, a transport mechanism (substrate transport device) that transports the substrate among the plurality of processing units is provided in the substrate processing apparatus.

For example, a transport mechanism of a substrate processing apparatus described in JP 2014-22589 A has a hand for holding a substrate. Further, a plurality of detectors for detecting a position of the substrate on the hand are provided in the transport mechanism. Coordinate information indicating a position from which the substrate is received by the hand and a position at which the substrate is placed by the hand in each processing unit is stored. A reference position is set on the hand in advance. When the substrate deviates from a predetermined position in one processing unit, the hand of the transport mechanism receives the substrate with the center of the substrate deviating from the reference position on the hand. In this case, a deviation of the substrate from the reference position on the hand is detected before the substrate is placed in another processing unit based on results of detection of the plurality of detectors. The coordinate information is corrected such that a deviation between a position of the center of the substrate that is to be placed by the hand in the other processing unit and a predetermined position in the other processing unit is cancelled based on the detected deviation. The transport mechanism is controlled based on the corrected coordinate information. Thus, the substrate is placed at the predetermined position in the other processing unit.

BRIEF SUMMARY OF THE INVENTION

In recent years, higher accuracy in processing of substrates has been required. In the above-mentioned substrate processing apparatus, in the case where position accuracy of the plurality of detectors of the transport mechanism is high, the substrate can be accurately transported to a predetermined position in each of the plurality of processing units. However, there is a limit to highly accurate adjustment of positions of the plurality of detectors during manufacture or maintenance of the substrate transport device.

An object of the present invention is to provide a substrate transport device capable of improving transport accuracy of a substrate, a detection position calibration method by which the transport accuracy of the substrate can be improved and a substrate processing apparatus in which the transport accuracy of the substrate can be improved.

(1) A substrate transport device according to one aspect of the present invention that transports a substrate includes a movable element, a first driver that moves the movable element, a holder that is configured to hold the substrate, a second driver that moves the holder in a first direction with respect to the movable element, a plurality of detectors that are provided to respectively detect a plurality of portions in an outer periphery of the substrate moved by the holder, and a transport controller that controls the first and second drivers, wherein the transport controller includes a deviation amount calculator that, during a detection position calibrating operation, moves the holder with respect to the movable element by the second driver, and calculates deviation amounts respectively between design positions of the plurality of detectors and actual positions of the plurality of detectors based on output signals of the plurality of detectors, a position detector that, during a substrate transport operation, detects a position of the substrate in the holder based on the output signals of the plurality of detectors and the deviation amounts calculated by the deviation amount calculator, and a movement controller that controls the first and second drivers based on the position detected by the position detector.

In the substrate transport device, the holder moves with respect to the movable element during the detection position calibrating operation. At this time, deviation amounts between the design positions of the plurality of detectors and the actual positions of the plurality of detectors are calculated based on the output signals of the plurality of detectors. During the substrate transport operation, the position of the substrate is detected based on the output signals of the plurality of detectors and the calculated deviation amounts. Thus, even in the case where there are deviations between the design positions and the actual positions of the plurality of detectors, the substrate can be transported to the predetermined position. Therefore, the transport accuracy of the substrate can be improved.

(2) The deviation amounts may include first offsets indicating deviation amounts between the design positions of the plurality of detectors and the actual positions of the plurality of detectors in the first direction.

In this case, deviation amounts between the design positions and the actual positions of the plurality of detectors in the first direction are calculated as the first offsets. Thus, a deviation of a detection position in the first direction of the substrate is corrected.

(3) The holder may be configured to have a predetermined reference position, and hold a reference substrate at the reference position during the detection position calibrating operation, and the deviation amount calculator, during the detection position calibrating operation, may move the holder holding the reference substrate at the reference position and may calculate the first offsets based on the output signals of the plurality of detectors. In this case, the first offset can be easily calculated.

(4) The substrate transport device may further include an abutment member attachable to the holder during the detection position calibrating operation, wherein the reference substrate may be positioned at the reference position by abutting against the abutment member. In this case, the reference substrate can be easily positioned at the reference position in the holder.

(5) The deviation amounts may further include second offsets indicating deviation amounts between the design positions of the plurality of detectors and the actual positions of the plurality of detectors in a second direction intersecting with the first direction.

In this case, deviation amounts between the design positions and the actual positions of the plurality of detectors in each of the first and second directions are calculated as each of the first and second offsets. Thus, deviations of the detection position in the first and second directions of the substrate are corrected.

(6) The holder may be configured to hold a reference substrate at first and second positions that are different from each other in the second direction during the detection position calibrating operation, and the deviation amount calculator, during the detection position calibrating operation, may move the holder holding the reference substrate at the first position, may move the holder holding the reference substrate at the second position, and may calculate the first and second offsets based on the output signals of the plurality of detectors that are output when the holder holding the reference substrate at the first position moves and the output signals of the plurality of detectors that are output when the holder holding the reference substrate at the second position moves. In this case, the first and second offsets can be easily calculated.

(7) The substrate transport device may further include first and second abutment members attachable to the holder during the detection position calibrating operation, wherein the first and second abutment members may have sizes different from each other, and the first and second abutment members may be attached to first and second portions of the holder respectively and the reference substrate may abut against the first and second abutment members to position the reference substrate at the first position, and the first and second abutment members may be attached to the second and first portions of the holder respectively and the reference substrate may abut against the first and second abutment members to position the reference substrate at the second position.

In this case, the reference substrate can be easily positioned at the first or second position in the holder.

(8) The deviation amount calculator may calculate deviation amounts depending on a movement speed of the holder during the detection position calibrating operation.

In this case, a change in deviation amount of the detection position of the substrate by the movement speed of the holder can be accurately corrected.

(9) The transport controller may further include a storage that stores control information for controlling the movement controller such that the holder places the substrate at a predetermined position, and a control information corrector that, during the substrate transport operation, may correct the control information based on the position detected by the position detector such that a deviation between a position at which the substrate is to be placed by the holder and the predetermined position is cancelled before the holder places the substrate at the predetermined position, and the movement controller may control the first and second drivers based on the corrected control information.

In this case, it is possible to place the substrate at the predetermined position while correcting the deviation of the detection position of the substrate based on the deviations between the design positions and the actual positions of the plurality of detectors.

(10) A detection position calibration method according to another aspect of the present invention for calibrating a position of a substrate detected by a plurality of detectors provided in a substrate transport device, the substrate transport device includes a movable element, a first driver that moves the movable element, a holder that is configured to hold the substrate, a second driver that moves the holder in a first direction with respect to the movable element, and a plurality of detectors that are provided to respectively detect a plurality of portions in an outer periphery of the substrate moved by the holder, and the detection position calibration method including the steps of, during a detection position calibrating operation, moving the holder with respect to the movable element by the second driver and calculating deviation amounts respectively between design positions of the plurality of detectors and actual positions of the plurality of detectors based on output signals of the plurality of detectors, and during a substrate transport operation, detecting a position of the substrate in the holder based on output signals of the plurality of detectors and the calculated deviation amounts.

In the detection position calibration method, the deviation amounts between the design positions of the plurality of detectors and the actual positions of the plurality of detectors are calculated during the detection position calibrating operation. During the substrate transport operation, the position of the substrate is detected based on the output signals of the plurality of detectors and the calculated deviation amounts. Thus, even in the case where there are deviations between the design positions and the actual positions of the plurality of detectors, the substrate can be transported to the predetermined position. Therefore, the transport accuracy of the substrate can be improved.

(11) A substrate processing apparatus that performs processing on a substrate includes a processing unit that is configured to have a supporter supporting the substrate and perform processing on the substrate supported by the supporter, and the substrate transport device, described above, wherein the movement controller of the substrate transport device transports the substrate to a predetermined position in the supporter of the processing unit by controlling the first and second drivers.

In the substrate processing apparatus, even in the case where there are deviations between the design positions and the actual positions of the plurality of detectors, the substrate can be transported to the predetermined position in the processing unit. Therefore, the transport accuracy of the substrate can be improved.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 13 is a schematic side view of the substrate processing apparatus mainly showing thermal processing sections and a cleaning drying processing section of FIG. 10.

DESCRIPTION OF THE PREFERRED EMBODIMENTS

A substrate transport device, a substrate processing apparatus including the substrate transport device and a detection position calibration method used in the substrate transport device, according to embodiments of the present invention, will be described below with reference to the drawings. In the following description, a substrate refers to a semiconductor substrate, a substrate for an FPD (Flat Panel Display) such as a liquid crystal display device or an organic EL (Electro Luminescence) display device, a substrate for an optical disc, a substrate for a magnetic disc, a substrate for a magneto-optical disc, a substrate for a photomask, a substrate for a solar cell or the like.

(1) Configuration of Substrate Transport Device According to First Embodiment

Figure 1A:
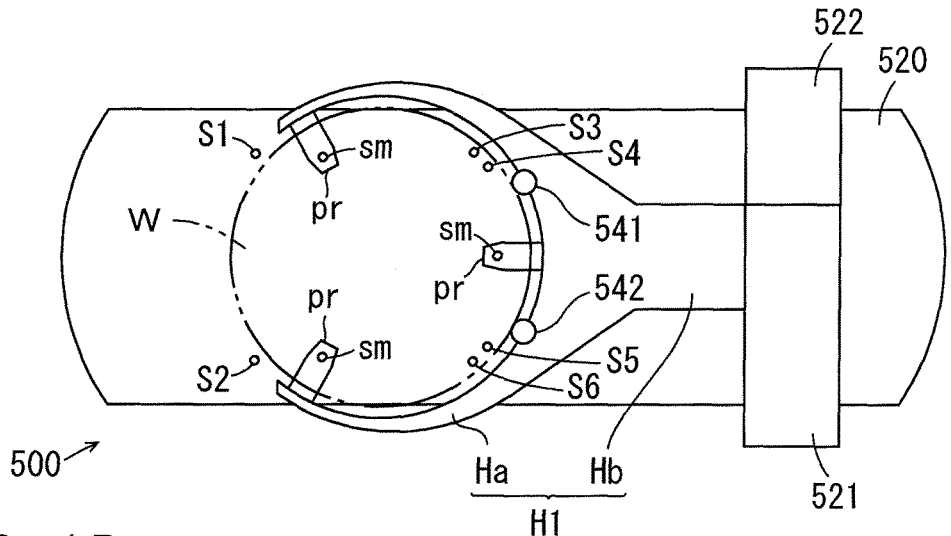
FIG. 1A is a plan view of a substrate transport device according to a first embodiment.
Figure 1B:
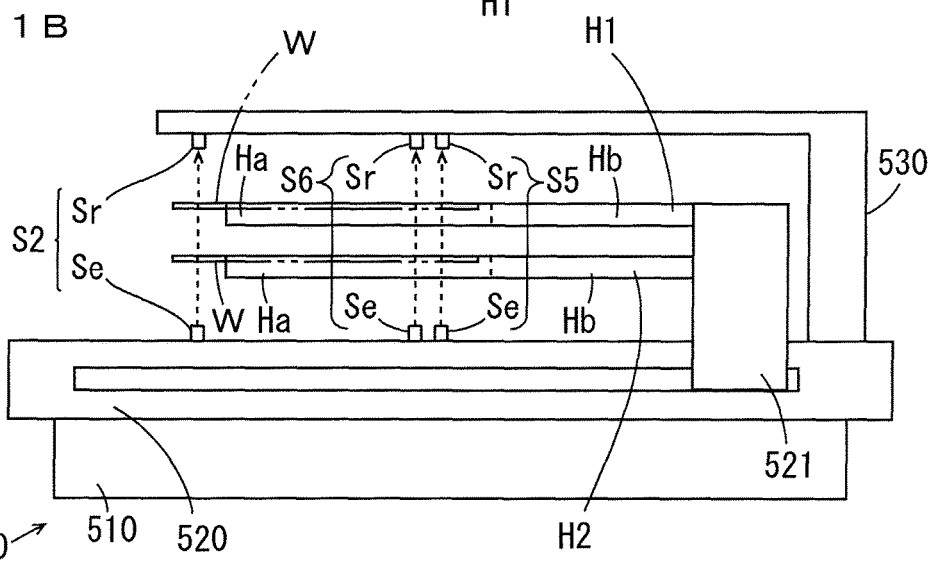
FIG. 1B is a side view of the substrate transport device according to the first embodiment.
Figure 1C:
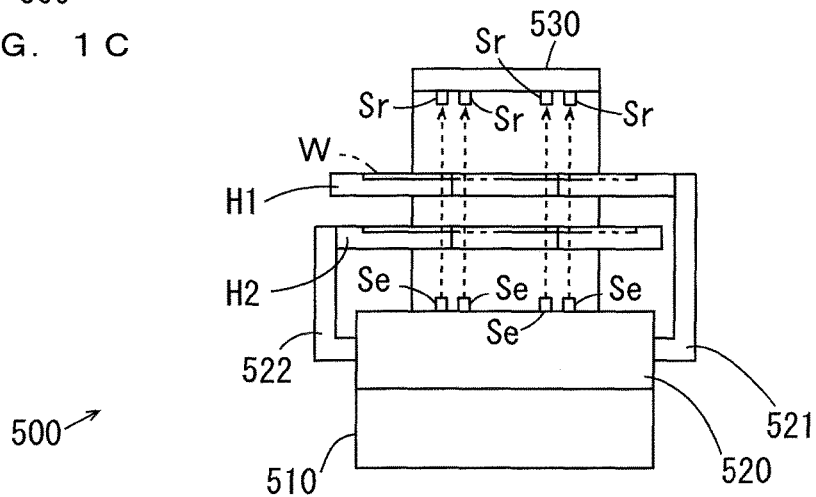
FIG. 1C is a front view of the substrate transport device according to the first embodiment.

FIGS. 1A, 1B and 1C are a plan view, a side view and a front view of the substrate transport device 500 according to the first embodiment.

The substrate transport device 500 of FIG. 1 includes a movement member 510 (FIGS. 1B and 1C), a rotation member 520, two hands H1, H2 and a plurality of detectors S1 to S6 (FIG. 1A). In the present embodiment, the six detectors S1 to S6 are provided. The movement member 510 is configured to be movable in a horizontal direction along a guide rail (not shown).

The substantially cuboid-shaped rotation member 520 is provided on the movement member 510 to be rotatable about an axis extending in an up-and-down direction. The hands H1, H2 are supported at the rotation member 520 by support members 521, 522, respectively. The hands H1, H2 are configured to be advanceable and retreatable in a longitudinal direction of the rotation member 520. In the present embodiment, the hand H2 is located above an upper surface of the rotation member 520, and the hand H1 is located above the hand H2.

The hand H1 is constituted by a guide portion Ha and an arm portion Hb. The guide portion Ha is substantially circular arc-shaped, and the arm portion Hb is oblong. At an inner periphery of the guide portion Ha, a plurality (three in the present example) of projections pr are formed to be directed inwardly of the guide portion Ha. A suction portion sm is provided at a tip of each projection pr. The suction portion sm is connected to an intake system (not shown). A substrate W is placed on the plurality of suction portions sm of the plurality of projections pr. In this state, a plurality of portions of the substrate W on the plurality of suction portions sm are respectively sucked by the intake system via the plurality of suction portions sm.

Each of the plurality of detectors S1 to S6 is a transmission-type photoelectric sensor constituted by a light emitter Se and a light receiver Sr. The plurality of light emitters Se are arranged at spacings along a circle corresponding to an outer periphery of the substrate W and attached to an upper surface of the rotation member 520. The plurality of light receivers Sr are arranged above the rotation member 520 by the support member 530 to be respectively opposite to the plurality of light emitters Se. In the present embodiment, the two detectors S1, S2 are provided at positions further forward than the four detectors S3 to S6 in an advancing retreating direction of the hand H1. Light is emitted upwardly from the plurality of respective light emitters Se. The plurality of light receivers Sr receive the light emitted from the respectively opposite light emitters Se as returning light.

In the case where the substrate W is present between the light emitter Se and the light receiver Sr of each detector S1 to S6, the light emitted from the light emitter Se is not incident on the light receiver Sr. A state where the light is not incident on the light receiver Sr is referred to as a light shield state. In the case where the substrate W is not present between the light emitter Se and the light receiver Sr of each detector S1 to S6, the light emitted from the light emitter Se is incident on the light receiver Sr. A state where the light is incident on the light receiver Sr is referred to as a light incident state. The light receiver Sr outputs a detection signal indicating the light incident state or the light shield state.

A limit position to which the hand H1, H2 can retreat in the advancing retreating direction of the hand H1, H2 on the rotation member 520 is referred to as an advancing retreating initial position (home position). A position of the outer periphery of the substrate W on the hand H1 can be detected based on a time point at which the detection signal of each detector S1, S2 switches from the light incident state to the light shield state and a time point at which the detection signal of each detector S3 to S6 switches from the light shield state to the light incident state, when the hand H1 holding the substrate W advances from the advancing retreating initial position on the rotation member 520. Similarly, a position of the outer periphery of the substrate W on the hand H1 can be detected based on a time point at which the detection signal of each detector S1, S2 switches from the light shield state to the light incident state and a time point at which the detection signal of each detector S3 to S6 switches from the light incident state to the light shield state, when the hand H1 holding the substrate W retreats to the advancing retreating initial position on the rotation member 520. Similarly, a position of the outer periphery of the substrate W on the hand H2 can be detected.

In each hand H1, H2, a reference position at which the center of the held substrate W is to be located (hereinafter referred to a reference position) is defined in advance. The reference position in the hand H1 is a position of the center of a circle formed along the inner periphery of the guide portion Ha, for example. The reference position in the hand H1 may be a position of the center among the plurality of suction portions sm.

A substrate, which is used during a detection position calibrating operation, described below, is referred to as a reference substrate WR. Two guide jigs 541, 542 are attachably and detachably provided at the guide portion Ha of the hand H1. In the present embodiment, the guide jigs 541, 542 are columnar and have the same diameter. The guide jigs 541, 542 are attached to the guide portion Ha such that their outer peripheral surfaces project inwardly from the inner periphery of the guide portion Ha. The reference substrate WR is placed on the hand H1 such that an outer peripheral end surface of the reference substrate WR abuts against the outer peripheral surfaces of the guide jigs 541, 542. In this state, the center of the reference substrate WR coincides with the reference position.

(2) Position Deviations of a Plurality of Detectors S1 to S6

Figure 2:
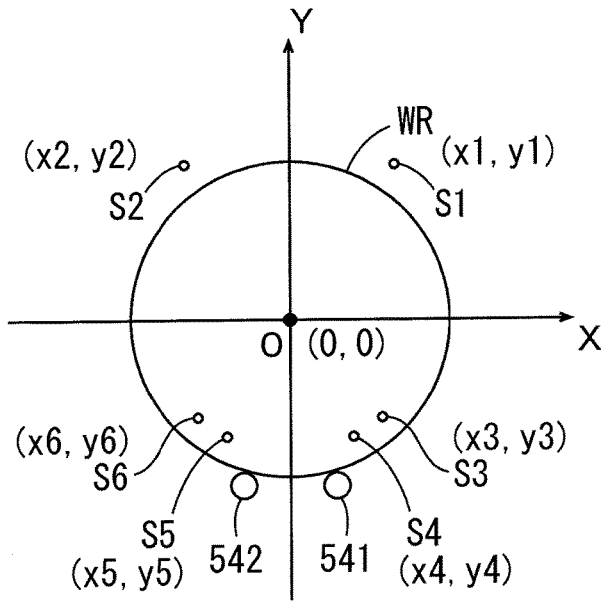
FIG. 2 is a diagram showing a positional relationship among a plurality of detectors.

FIG. 2 is a diagram showing a positional relationship among the plurality of detectors S1 to S6. In FIG. 2, an XY coordinate system having a Y axis in parallel with the advancing retreating direction of the hands H1, H2 and an X axis orthogonal to the advancing retreating direction of the hands H1, H2 on the rotation member 520 of FIG. 1A is defined. The reference position in each hand H1, H2 in the case where the hand H1, H2 is located at the advancing retreating initial position is an origin O of the XY coordinate system. According to the design, the plurality of detectors S1 to S6 are arranged on a circle having the same radius as that of the reference substrate WR. Positions of the detectors S1 to S6 in accordance with the design are referred to as design positions. Coordinates (hereinafter referred to as design coordinates) of the design positions of the detectors S1 to S6 are respectively (X1, Y1), (X2, Y2), (X3, Y3), (X4, Y4), (X5, Y5) and (X6, Y6). When the reference substrate WR abuts against the guide jigs 541, 542 attached to the hand H1, H2, the center of the reference substrate WR coincides with the coordinates (0, 0) of the reference position. In this case, when the hand H1, H2 advances from the advancing retreating initial position by a constant distance, the detectors S1 to S6 are respectively located on the outer periphery of the reference substrate WR.

Respective actual positions of the detectors S1 to S6 may deviate from the respective design positions. Hereinafter, actual positions of the detectors S1 to S6 are referred to as actual positions, and coordinates of the actual positions are referred to as actual coordinates. Here, the actual coordinates of the detectors S1 to S6 are respectively (x1, y1), (x2, y2), (x3, y3), (x4, y4), (x5, y5) and (x6, y6). Deviations in the Y axis direction in the case where the respective actual positions of the detectors S1 to S6 deviate from the respective design positions in the X axis direction are small. As such, in the present embodiment, a method of calculating the actual coordinates in the case where the respective actual positions of the detectors S1 to S6 deviate from the respective design positions only in the Y axis direction is described. Hereinafter, deviation amounts of the respective actual coordinates from the respective design coordinates of the detectors S1 to S6 are referred to as offsets.

Figure 3:
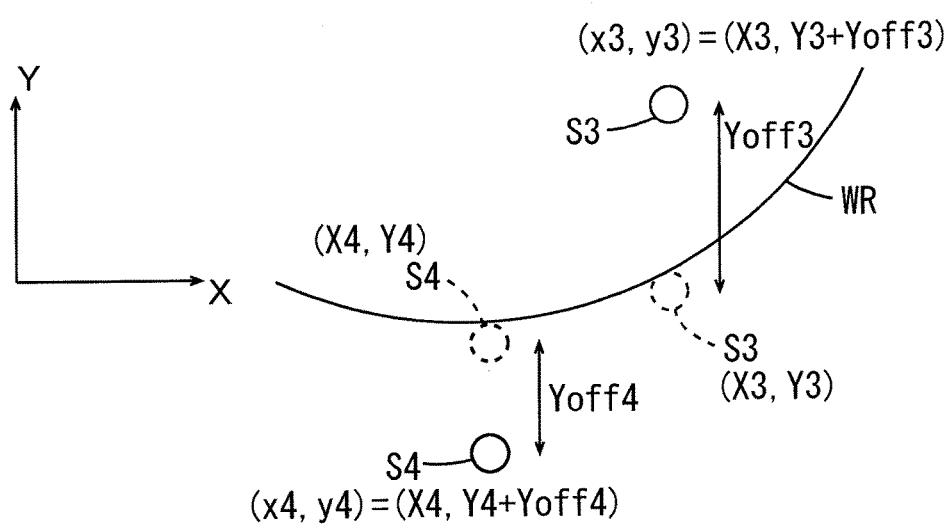
FIG. 3 is a diagram for explaining position deviations of the detectors.

FIG. 3 is a diagram for explaining position deviations of the detectors S1 to S6. In FIG. 3, design positions of the detectors S3, S4 are indicated by dotted lines, and actual positions of the detectors S3, S4 are indicated by solid lines. The respective actual positions of the detectors S3, S4 deviate from the respective design positions in the Y axis direction. Deviation amounts of the respective actual coordinates from the respective design coordinates of the detectors S1 to S6 in the Y axis direction are respectively referred to as offsets Yoff1 to Yoff6. An offset in an advancing direction of the hand H1, H2 is indicated by a positive value, and an offset in a retreating direction of the hand H1, H2 is indicated by a negative value.

The actual coordinates of the detectors S1 to S6 are as follows.

(x1, y1)=(X1, Y1+Yoff1)
(x2, y2)=(X2, Y2+Yoff2)
(x3, y3)=(X3, Y3+Yoff3)
(x4, y4)=(X4, Y4+Yoff4)
(x5, y5)=(X5, Y5+Yoff5)
(x6, y6)=(X6, Y6+Yoff6)

The design coordinates (X1, Y1) to (X6, Y6) of the detectors S1 to S6 are known. In the present example, the actual coordinates (x1, y1) to (x6, y6) of the detectors S1 to S6 are calculated with use of the hand H1 holding the reference substrate WR. For example, the actual coordinates (x1, y1) to (x6, y6) of the detectors S1 to S6 are respectively calculated based on the detection signals of the detectors S1 to S6 and an output signal of an upper hand encoder 526, described below, which are output when the hand H1 holding the reference substrate WR advances from the advancing retreating initial position. Specifically, the actual coordinates (x1, y1), (x2, y2) can be respectively calculated based on time points at which the detection signals of the detectors S1, S2 switch from the light incident state to the light shield state when the hand H1 advances from the advancing retreating initial position. The actual coordinates (x3, y3) to (x6, y6) can be respectively calculated based on time points at which the detection signals of the detectors S3 to S6 switch from the light shield state to the light incident state when the hand H1 advances from the advancing retreating initial position. Next, the offsets Yoff1 to Yoff6 can be respectively calculated by the above formulas with use of the actual coordinates (x1, y1) to (x6, y6) and the design coordinates (X1, Y1) to (X6, Y6) of the detectors S1 to S6.

(3) Configuration of Control System of Substrate Transport Device 500

Figure 4:
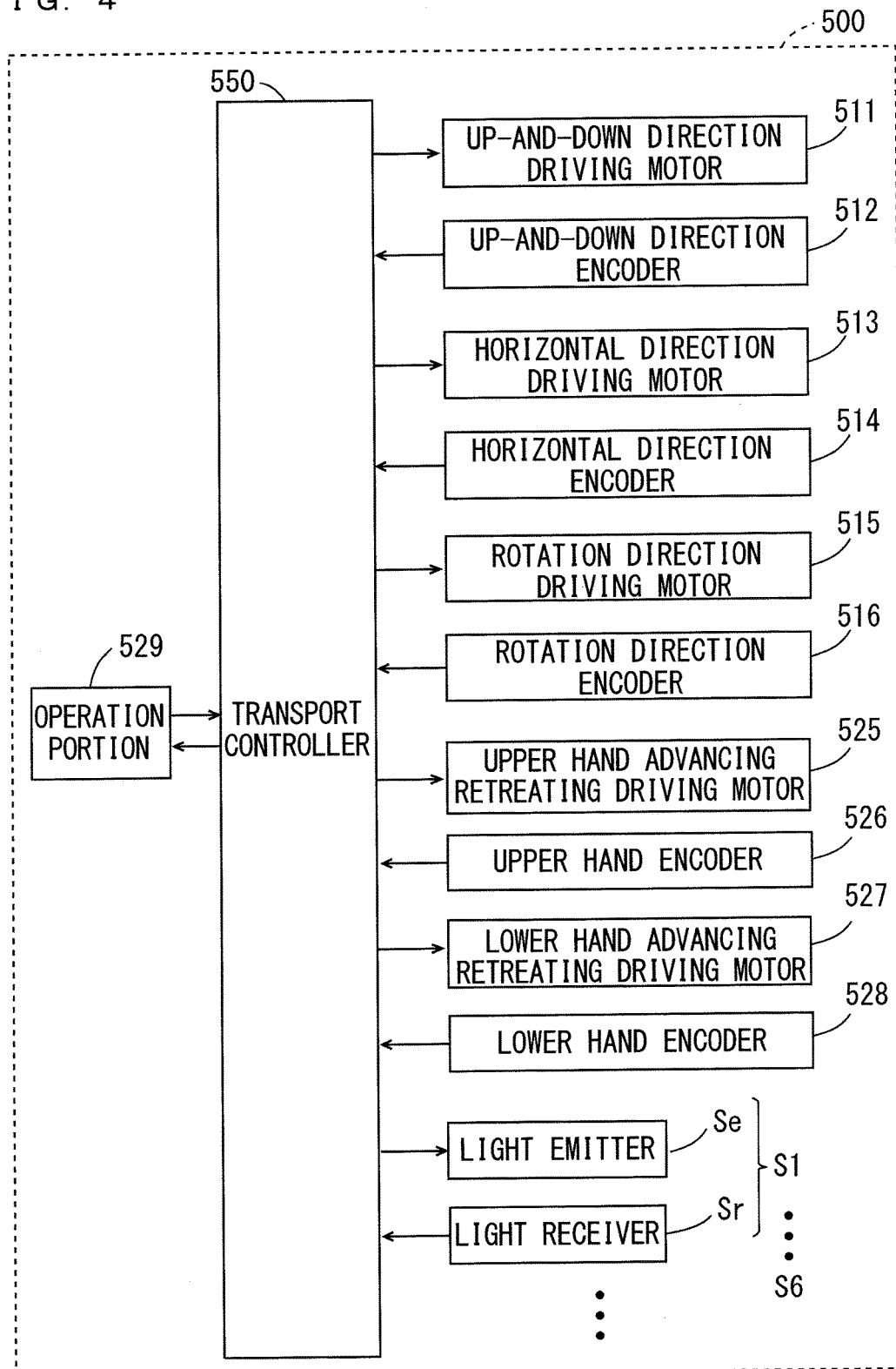
FIG. 4 is a block diagram showing a configuration of a control system of the substrate transport device.

FIG. 4 is a block diagram showing the configuration of the control system of the substrate transport device 500. As shown in FIG. 4, the substrate transport device 500 includes an up-and-down direction driving motor 511, an up-and-down direction encoder 512, a horizontal direction driving motor 513, a horizontal direction encoder 514, a rotation direction driving motor 515, a rotation direction encoder 516, an upper hand advancing retreating driving motor 525, the upper hand encoder 526, a lower hand advancing retreating driving motor 527, a lower hand encoder 528, the plurality of detectors S1 to S6, a transport controller 550 and an operation portion 529.

The up-and-down direction driving motor 511 moves the movement member 510 of FIG. 1 in the up-and-down direction by control of the transport controller 550. The up-and-down direction encoder 512 outputs a signal indicating a rotation angle of the up-and-down direction driving motor 511 to the transport controller 550. Thus, the transport controller 550 can detect a position in the up-and-down direction of the movement member 510.

The horizontal direction driving motor 513 moves the movement member 510 of FIG. 1 in the horizontal direction by control of the transport controller 550. The horizontal direction encoder 514 outputs a signal indicating a rotation angle of the horizontal direction driving motor 513 to the transport controller 550. Thus, the transport controller 550 can detect a position in the horizontal direction of the movement member 510.

The rotation direction driving motor 515 rotates the rotation member 520 of FIG. 1 about an axis extending in the up-and-down direction by control of the transport controller 550. The rotation direction encoder 516 outputs a signal indicating a rotation angle of the rotation direction driving motor 515 to the transport controller 550. Thus, the transport controller 550 can detect an orientation of the rotation member 520 in a horizontal plane.

The upper hand advancing retreating driving motor 525 advances and retreats the hand H1 of FIG. 1 on the rotation member 520 in the horizontal direction by control of the transport controller 550. The upper hand encoder 526 outputs a signal indicating a rotation angle of the upper hand advancing retreating driving motor 525 to the transport controller 550. Thus, the transport controller 550 can detect a position of the hand H1 on the rotation member 520.

The lower hand advancing retreating driving motor 527 advances and retreats the hand H2 of FIG. 1 on the rotation member 520 in the horizontal direction by control of the transport controller 550. The lower hand encoder 528 outputs a signal indicating a rotation angle of the lower hand advancing retreating driving motor 527 to the transport controller 550. Thus, the transport controller 550 can detect a position of the hand H2 on the rotation member 520.

In FIG. 4, only the detector S1 of the detectors S1 to S6 is shown. The light emitters Se of the detectors S1 to S6 respectively emit light towards the light receivers Sr by control of the transport controller 550. Detection signals of the light receivers Sr are supplied to the transport controller 550. Thus, the transport controller 550 can determine whether each detector S1 to S6 is in the light incident state or the light shield state. The transport controller 550 can detect a plurality of positions in the outer periphery of the substrate on the hand H1 based on detection signals of the plurality of detectors S1 to S6 and an output signal of the upper hand encoder 526. Similarly, the transport controller 550 can detect a plurality of positions in the outer periphery of the substrate on the hand H2 based on detection signals of the plurality of detectors S1 to S6 and an output signal of the lower hand encoder 528.

Hereinafter, coordinates of positions, in the outer periphery of the substrate, which are detected based on the detection signals of the plurality of detectors S1 to S6 are referred to as detection coordinates. In the case where the reference substrate WR is placed at the reference position in the hand H1, detection coordinates detected by the plurality of detectors S1 to S6 correspond to actual coordinates of the plurality of detectors S1 to S6. Similarly, in the case where the reference substrate WR is placed at the reference position in the hand H2, detection coordinates detected by the plurality of detectors S1 to S6 correspond to actual coordinates of the plurality of detectors S1 to S6. In the following description, during the detection position calibrating operation, the detection coordinates of the plurality of detectors S1 to S6 are detected as the actual coordinates of the plurality of detectors S1 to S6 with the reference substrate WR placed at the reference position in the hand H1. The operation portion 529 is connected to the transport controller 550. A user can supply various types of commands and information to the transport controller 550 by operating the operation portion 529.

(4) Functional Configuration of Transport Controller 550

Figure 5:
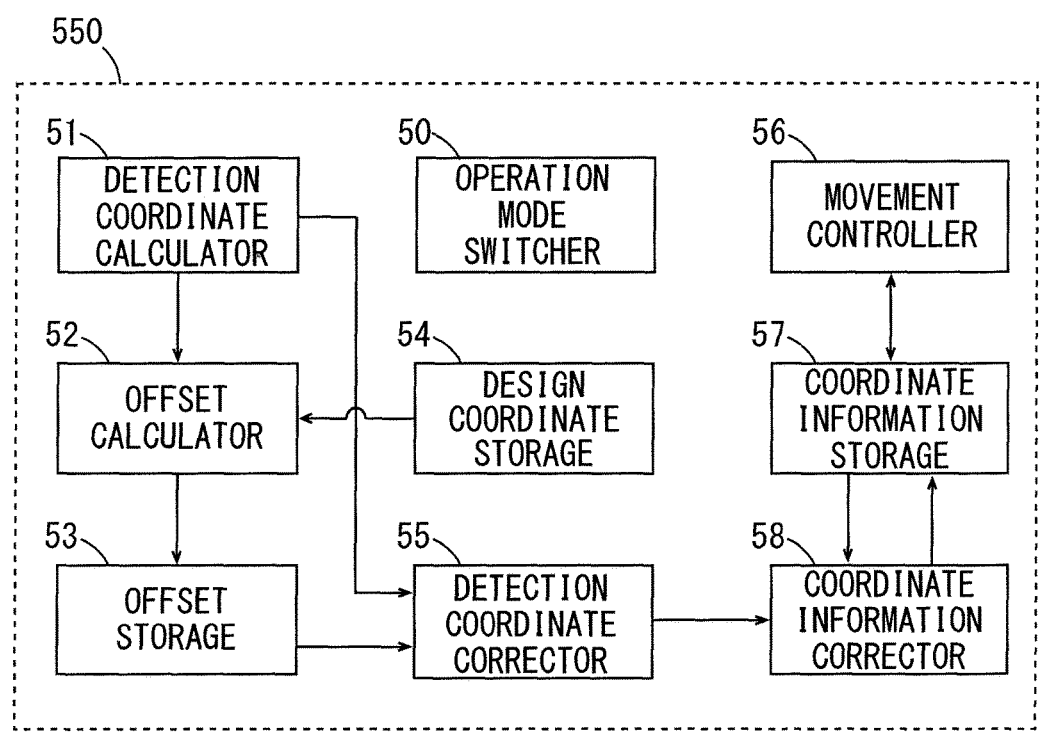
FIG. 5 is a block diagram showing a functional configuration of a transport controller.

FIG. 5 is a block diagram showing the functional configuration of the transport controller 550. The transport controller 550 includes an operation mode switcher 50, a detection coordinate calculator 51, an offset calculator 52, an offset storage 53, a design coordinate storage 54, a detection coordinate corrector 55, a movement controller 56, a coordinate information storage 57 and a coordinate information corrector 58. The transport controller 550 is constituted by a CPU (Central Processing Unit), a RAM (Random Access Memory), a ROM (Read Only Memory) and a storage device. The CPU executes a computer program stored in a storage medium such as the ROM or the storage device, whereby a function of each constituent element of the transport controller 550 is realized. Part or all of the constituent elements of the transport controller 550 may be realized by hardware such as an electronic circuit.

Here, the substrate transport device 500 receives the substrate placed at a predetermined position (hereinafter referred to as a reception position) in one processing unit, transports the substrate and places the substrate at a predetermined position (hereinafter referred to as a placement position) in another processing unit. The reception position and the placement position are indicated by coordinates of a fixed UVW coordinate system. Coordinates of the reception position are referred to as reception coordinates, and coordinates of the placement position are referred to as placement coordinates.

The operation mode switcher 50 switches an operation mode of the substrate transport device 500 to the detection position calibrating operation or a substrate transport operation based on an operation of the operation portion 529 by the user. The design coordinate storage 54 stores the design coordinates of the plurality of detectors S1 to S6 in advance. During the detection position calibrating operation, the detection coordinate calculator 51 calculates detection coordinates in the outer periphery of the reference substrate WR placed at the reference position on the hand H1. In this case, the detection coordinates of the plurality of detectors S1 to S6 correspond to the actual coordinates of the plurality of detectors S1 to S6. Further, during the substrate transport operation, the detection coordinate calculator 51 calculates detection coordinates in the outer periphery of the substrate W placed on the hand H1 or the hand H2.

During the detection position calibrating operation, the offset calculator 52 calculates offsets of the plurality of detectors S1 to S6 based on the detection coordinates (the actual coordinates) calculated by the detection coordinate calculator 51 and the design coordinates stored in the design coordinate storage 54. The offset storage 53 stores the offsets of the plurality of detectors S1 to S6 calculated by the offset calculator 52.

The coordinate information storage 57 stores the reception coordinates of the reception position and the placement coordinates of the placement position in advance as the coordinate information. During the substrate transport operation, the detection coordinate corrector 55 corrects the detection coordinates calculated by the detection coordinate calculator 51 based on the offsets of the plurality of detectors S1 to S6 stored by the offset storage 53. Specifically, the detection coordinate corrector 55 corrects the detection coordinates by subtracting the respective offsets of the plurality of detectors S1 to S6 from the respective detection coordinates.

During the substrate transport operation, the coordinate information corrector 58 corrects the coordinate information stored in the coordinate information storage 57 based on the detection coordinates corrected by the detection coordinate corrector 55. The movement controller 56 controls the up-and-down direction driving motor 511, the horizontal direction driving motor 513 and the rotation direction driving motor 515 of FIG. 4 and controls the upper hand advancing retreating driving motor 525 or the lower hand advancing retreating driving motor 527, such that the substrate is transported from the reception position to the placement position based on the coordinate information stored in the coordinate information storage 57.

(5) Operation of Substrate Transport Device 500

Figure 6:
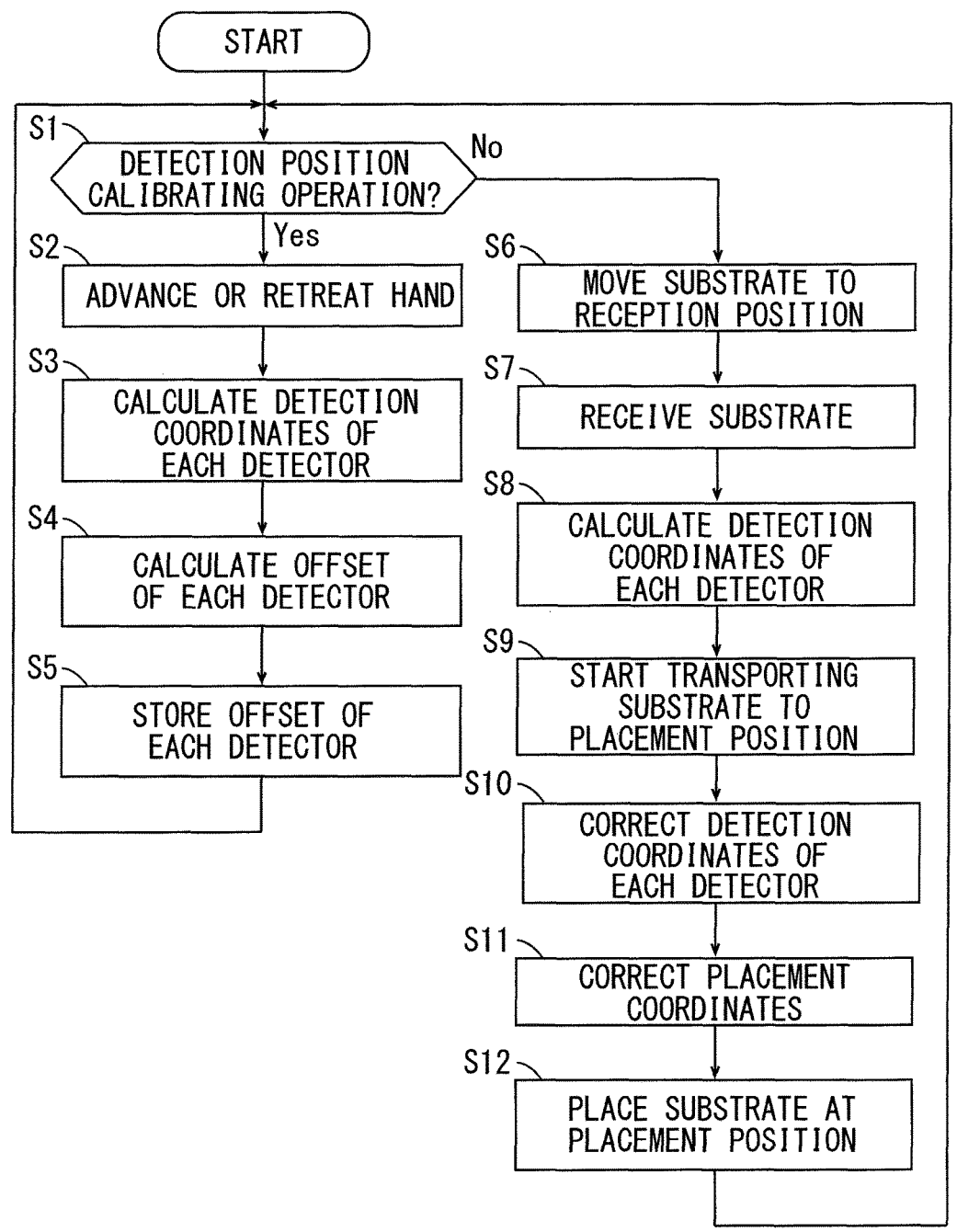
FIG. 6 is a flow chart showing operations of the substrate transport device.

FIG. 6 is a flow chart showing the operation of the substrate transport device 500. The user sets the operation mode of the substrate transport device 500 to one of the detection position calibrating operation and the substrate transport operation using the operation portion 529 of FIG. 4. In the case where the operation mode is set to the detection position calibrating operation, the user attaches the guide jigs 541, 542 to the hand H1 or the hand H2, and places the reference substrate WR at the reference position in the hand H1 or the hand H2. The detection position calibrating operation with use of the hand H1 will be described below.

The operation mode switcher 50 of FIG. 5 determines whether the operation mode of the substrate transport device 500 is the detection position calibrating operation based on an operation of the operation portion 529 (step S1). In the case where the operation mode is the detection position calibrating operation, the movement controller 56 allows the hand H1 to advance or retreat on the rotation member 520 of the substrate transport device 500 (step S2). At this time, the detection coordinate calculator 51 calculates detection coordinates of each detector S1 to S6 based on the detection signals of the plurality of detectors S1 to S6 and the output signal of the upper hand encoder 526 (step S3). In this case, the detection coordinates detected by the plurality of detectors S1 to S6 are equivalent to the actual coordinates of the plurality of detectors S1 to S6. Next, the offset calculator 52 calculates offsets of the plurality of detectors S1 to S6 based on the actual coordinates acquired by the detection coordinate calculator 51 and the design coordinates stored in the design coordinate storage 54 (step S4). The offset storage 53 stores the offsets calculated by the offset calculator 52 (step S5) and returns to the step S1.

In the case where the operation mode is the substrate transport operation, the movement controller 56 allows the substrate transport device 500 to move to a position in the vicinity of a reception position based on the reception coordinates of the coordinate information stored in the coordinate information storage 57 (step S6), and allows the hand H1 to receive a substrate from the reception position (step S7). At this time, the detection coordinate calculator 51 calculates detection coordinates of each detector S1 to S6 based on the detection signal of each of the plurality of detectors S1 to S6 and the output signal of the upper hand encoder 526 (step S8). In the case where the substrate deviates from the reception position, the substrate is received by the hand H1 with a position of the center of the substrate deviating from the reference position in the hand H1.

The movement controller 56 allows the substrate transport device 500 to start transporting the substrate to a placement position based on placement coordinates of the coordinate information stored in the coordinate information storage 57 (step S9). During the transportation of the substrate by the substrate transport device 500, the detection coordinate corrector 55 corrects the detection coordinates calculated by the detection coordinate calculator 51 based on the offsets stored in the offset storage 53 (step S10). The coordinate information corrector 58 corrects the placement coordinates of the coordinate information stored in the coordinate information storage 57 based on the detection coordinates corrected by the detection coordinate corrector 55 (step S11). In this case, the coordinate information corrector 58 corrects the placement coordinates such that a deviation between a position at which the substrate is to be placed by the hand H1 and the placement position is cancelled.

The movement controller 56 allows the substrate held by the hand H1 to be placed at the placement position based on the corrected placement coordinates stored in the coordinate information storage 57 (step S12). Thus, the position of the substrate coincides with the placement position. Thereafter, the operation mode switcher 50 returns to the step S1. The substrate transport operation with use of the hand H2 is similar to the substrate transport operation with use of the hand H1.

(6) Effects of First Embodiment

In the substrate transport device 500 according to the present embodiment, during the detection position calibrating operation, the hand H1 (or the hand H2) holding the reference substrate WR advances or retreats with respect to the rotation member 520. At this time, deviation amounts between the design coordinates of the plurality of detectors S1 to S6 and the actual coordinates of the plurality of detectors S1 to S6 are calculated as the offsets based on the detection signals of the plurality of detectors S1 to S6. During the substrate transport operation, the detection coordinates of the plurality of detectors S1 to S6 are corrected based on the offsets. Thus, a position of the substrate W on the hand H1 (or the hand H2) is accurately detected. Further, the placement coordinates of the coordinate information are corrected based on the detection coordinates, and the substrate W held by the hand H1 (or the hand H2) is transported based on the corrected placement coordinates. Therefore, even in the case where there are deviations between the design positions and the actual positions of the plurality of detectors S1 to S6, the substrate W can be transported to the predetermined position. As a result, transport accuracy of the substrate W can be improved.

(7) Detection Position Calibrating Operation in Second Embodiment

A substrate transport device 500 according to the second embodiment is different from the substrate transport device 500 according to the first embodiment in that deviations in the X axis direction of the detectors S1 to S6 are corrected in the detection position calibrating operation. A configuration of the entire substrate transport device 500 and a configuration of a transport controller 550 according to the second embodiment are similar to the configurations shown in FIGS. 1A, 1B, 1C, 4 and 5.

Figure 7A:
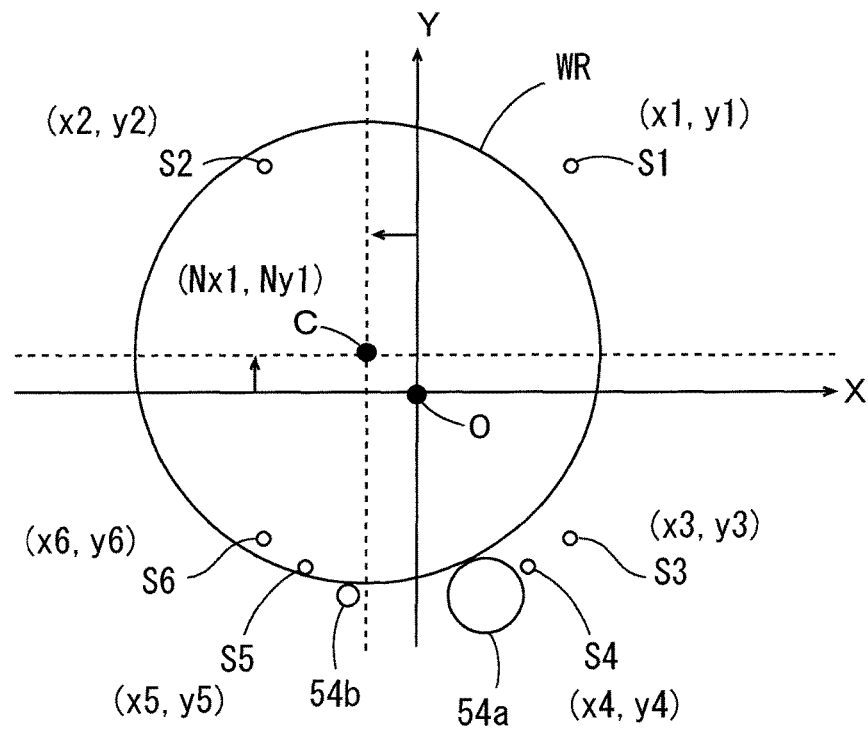
FIGS. 7A and 7B are diagrams showing a positional relationship between a plurality of detectors and a substrate in a second embodiment.
Figure 7B:
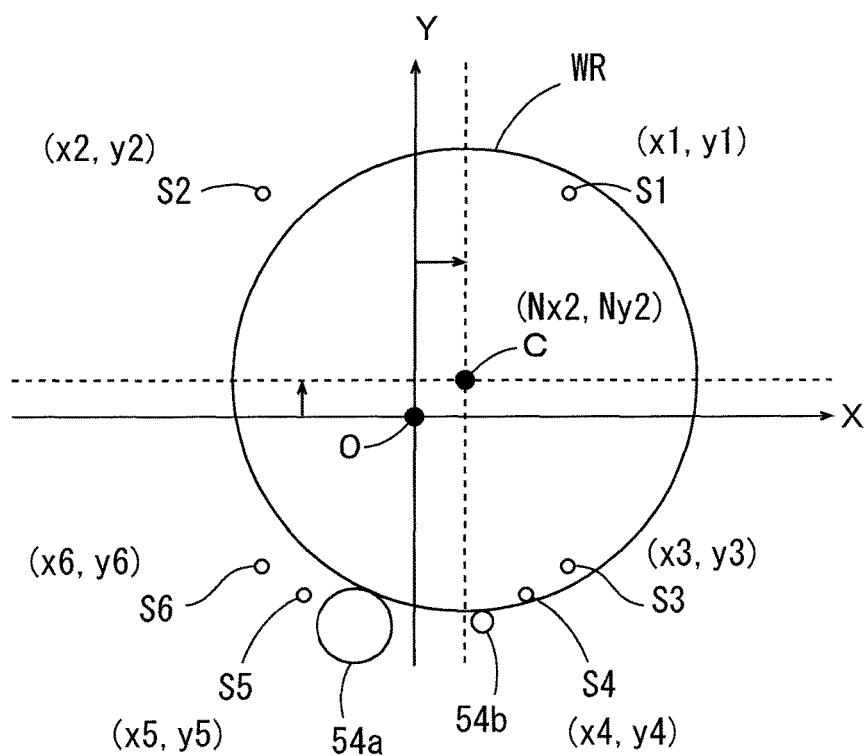

FIGS. 7A and 7B are diagrams showing a positional relationship between a plurality of detectors S1 to S6 and a substrate in the second embodiment. In the following description, the reference substrate WR is held by the hand H1 (see FIG. 1A). The invention also applies to the case where the reference substrate WR is held by the hand H2 (see FIG. 1B). In FIG. 7, the hand H1 is not shown.

Similarly to the first embodiment, the design coordinates of the detectors S1 to S6 are respectively (X1, Y1), (X2, Y2), (X3, Y3), (X4, Y4), (X5, Y5) and (X6, Y6). In the second embodiment, guide jigs 54a, 54b having different diameters are attached to the hand H1 instead of the guide jigs 541, 542. The guide jig 54a has a diameter larger than that of the guide jig 54b. As shown in FIG. 7A, in the case where the guide jig 54a is attached to a right portion of the hand H1, and the guide jig 54b is attached to a left portion of the hand H1, the reference substrate WR abutting against the guide jigs 54a, 54b shifts leftwardly and forwardly on the hand H1. Thus, the center C of the reference substrate WR is located in a second quadrant further leftward and upward than the origin O of the XY coordinate system. Coordinates of the center C of the reference substrate WR are (Nx1, Ny1). Hereinafter, as shown in FIG. 7A, the position of the reference substrate WR in the case where the guide jig 54a is attached to the right portion of the hand H1 and the guide jig 54b is attached to the left portion of the hand H1 is referred to as a left position.

As shown in FIG. 7B, in the case where the guide jig 54a is attached to the left portion of the hand H1 and the guide jig 54b is attached to the right portion of the hand H1, the reference substrate WR abutting against the guide jigs 54a, 54b shifts rightwardly and forwardly on the hand H1. Thus, the center C of the reference substrate WR is located in a first quadrant that is further rightward and upward than the origin O of the XY coordinate system. Coordinates of the center C of the reference substrate WR are (Nx2, Ny2). Hereinafter, as shown in FIG. 7B, a position of the reference substrate WR in the case where the guide jig 54a is attached to the left portion of the hand H1, and the guide jig 54b is attached to the right portion of the hand H1 is referred to as a right position.

Figure 8A:
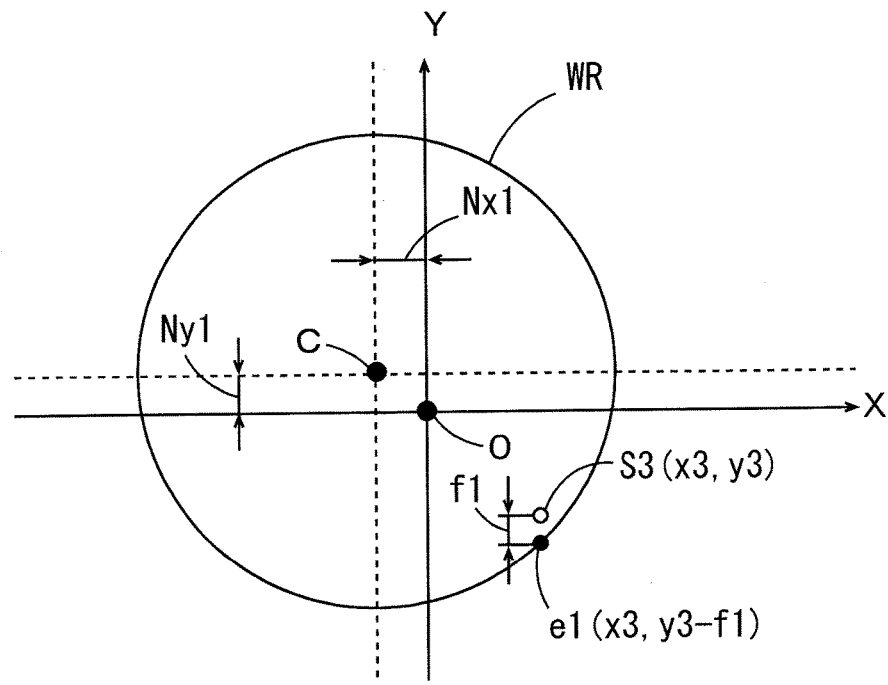
FIGS. 8A and 8B are diagrams showing a method of calculating actual coordinates of a detector.
Figure 8B:
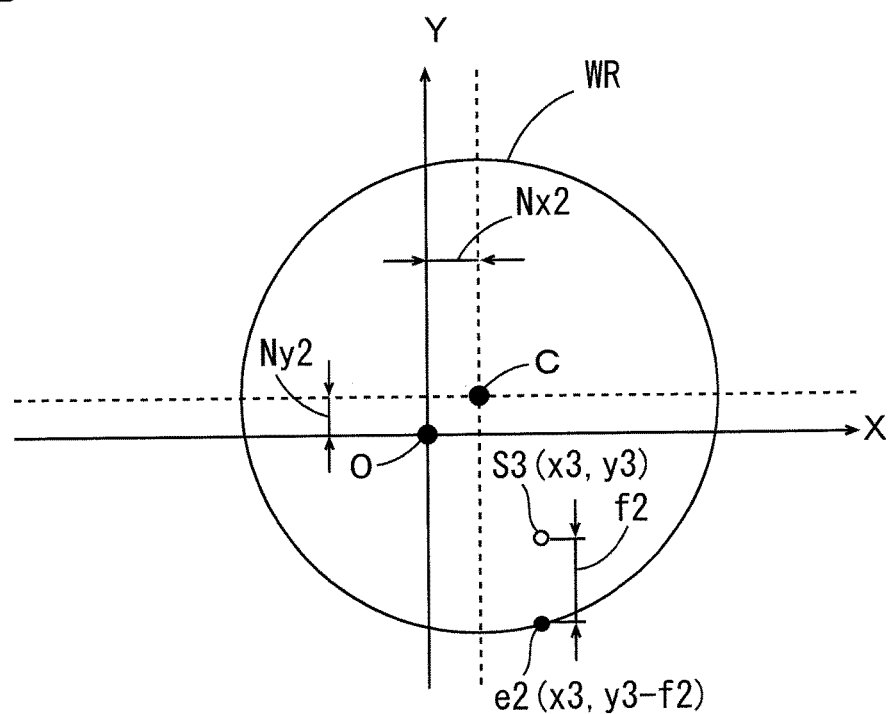

Here, actual coordinates of the detectors S1 to S6 are respectively (x1, y1), (x2, y2), (x3, y3), (x4, y4), (x5, y5) and (x6, y6). A method of calculating the actual coordinates of the detector S3 in consideration of deviations in the X axis direction and the Y axis direction will be described below. FIGS. 8A and 8B are diagrams showing the method of calculating the actual coordinates of the detector S3. A radius of the reference substrate WR is R. The hand H1 is not shown in FIGS. 8A and 8B either.

FIG. 8A shows a positional relationship between the detector S3 and the reference substrate WR with the reference substrate WR located at the left position in the hand H1, and FIG. 8B shows a positional relationship between the detector S3 and the reference substrate WR with the reference substrate WR located at the right position in the hand H1. In FIGS. 8A and 8B, a reference position in the hand H1 in the case where the hand H1 is located at the advancing retreating initial position is the origin O of the XY coordinate system. At this time, the actual coordinates of the detector S3 are (x3, y3).

As shown in FIG. 8A, in the case where the reference substrate WR is at the left position in the hand H1, a deviation amount between the detector S3 and an outer periphery of the reference substrate WR in an X coordinate x3 is f1. In this case, a Y coordinate of the outer periphery of the reference substrate WR in the X coordinate x3 that is the same as the X coordinate of the detector S3 is (y3−f1). The coordinates (x3, y3−f1) of the outer periphery of the reference substrate WR are on a circle having a radius R with the center C of the reference substrate WR as a center. Coordinates of the center C of the reference substrate WR are (Nx1, Ny1), so that the following formula holds:

$$(x3-Nx1)^2+(y3-f1-Ny1)^2=R^2 \quad (1)$$

As shown in FIG. 8B, in the case where the reference substrate WR is at the right position in the hand H1, a deviation amount between the detector S3 and the outer periphery of the reference substrate WR in the X coordinate x3 is f2. In this case, a Y coordinate of the outer periphery of the reference substrate WR in the X coordinate x3 that is the same as the X coordinate of the detector S3 is (y3−f2). The coordinates (x3, y3−f2) of the outer periphery of the reference substrate WR are on a circle having the radius R with the center C of the reference substrate WR as a center. Coordinates of the center C of the reference substrate WR are (Nx2, Ny2), so that the following formula holds:

$$(x3-Nx2)^2+(y3-f2-Ny2)^2=R^2 \quad (2)$$

The deviation amounts f1, f2 can be detected based on a time point at which a detection signal of the detector S3 switches from the light shield state to the light incident state when the hand H1 advances from the advancing retreating initial position. Therefore, in the above formulas (1) and (2), Nx1, Ny1, Nx2, Ny2, f1, f2 and R are known. Therefore, solutions of the simultaneous equations of the above formulas (1) and (2) are found, whereby the actual coordinates (x3, y3) of the detector S3 can be calculated. Similarly, the actual coordinates (x1, y1), (x2, y2), (x4, y4), (x5, y5) and (x6, y6) of the detectors S1, S2, S4, S5, S6 can be calculated. Of deviation amounts of the actual coordinates from the design coordinates of the detectors S1 to S6, deviation amounts in the X axis direction are referred to as offsets Xoff1 to Xoff6, and deviation amounts in the Y axis direction are referred to as offsets Yoff1 to Yoff6.

The actual coordinates of the detectors S1 to S6 are as follows.

(x1, y1)=(X1+Yoff1, Y1+Yoff1)
(x2, y2)=(X2+Yoff2, Y2+Yoff2)
(x3, y3)=(X3+Yoff3, Y3+Yoff3)
(x4, y4)=(X4+Yoff4, Y4+Yoff4)
(x5, y5)=(X5+Yoff5, Y5+Yoff5)
(x6, y6)=(X6+Yoff6, Y6+Yoff6)

Therefore, differences between the actual coordinates (x1, y1) to (x6, y6) of the detectors S1 to S6 and the design coordinates (X1, Y1) to (X6, Y6) of the detectors S1 to S6 are calculated, whereby the offsets Xoff1 to Xoff6 in the X axis direction and the offsets Yoff1 to Yoff6 in the Y axis direction can be calculated.

During the detection position calibrating operation, the offset calculator 52 of FIG. 5 calculates the offsets Xoff1 to Xoff6 and the offsets Yoff1 to Yoff6. The offset storage 53 stores the offsets Xoff1 to Xoff6 and the offsets Yoff1 to Yoff6. During the substrate transport operation, the detection coordinate corrector 55 corrects the detection coordinates calculated by the detection coordinate calculator 51 based on the offsets Xoff1 to Xoff6 and the offsets Yoff1 to Yoff6.

(8) Effects of Second Embodiment

In the substrate transport device 500 according to the present embodiment, even in the case where there are deviations between the design positions and the actual positions of the plurality of detectors S1 to S6 in the X axis direction and the Y axis direction, the position of the substrate W on each hand H1, H2 can be accurately detected based on the offsets Xoff1 to Xoff6 in the X axis direction and the offsets Yoff1 to Yoff6 in the Y axis direction. Thus, the substrate W can be accurately transported to a predetermined position, and transport accuracy of the substrate W can be further improved.

(9) Correction of Offset by Movement Speed of Hand

A time difference between a time point at which the detection signal from each detector S1 to S6 is output and a time point at which the signal from the upper hand encoder 526 or the lower hand encoder 528 is output differs depending on the movement speed of the hand H1, H2. For example, the higher the movement speed of the hand H1, H2 is, the larger the time difference is. Thus, when the movement speed of the hand H1, H2 changes, the calculated offsets change. Therefore, the offsets, relating to each of the detectors S1 to S6, that change depending on the movement speed of the hand H1, H2 are stored in advance.

Figure 9:
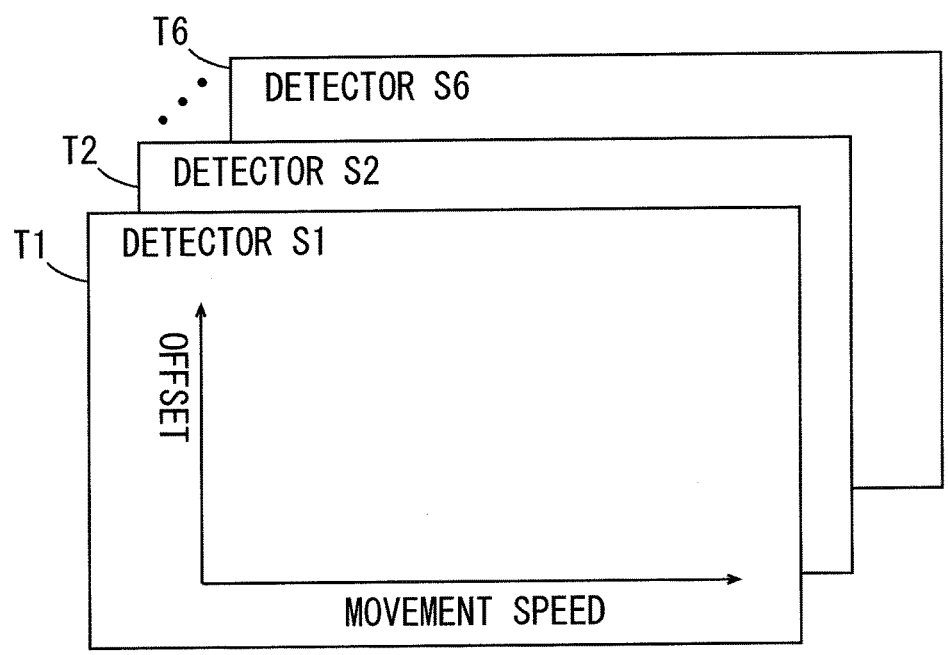
FIG. 9 is a schematic diagram showing an offset change table relating to the detectors.

FIG. 9 is a schematic diagram showing offset change tables relating to the detectors S1 to S6. The offset change tables T1 to T6 show relationships between the offsets and the movement speed of the hand H1, H2.

When detection coordinates of each detector S1 to S6 are corrected in the step S10 of FIG. 6, the detection coordinate corrector 55 may acquire offsets corresponding to the movement speed of the hand H1, H2 from the offset change tables of FIG. 9, and may correct the detection coordinates using the acquired offsets. Thus, a position of the substrate W held by the hand H1, H2 can be more accurately detected.

The substrate transport device 500 performs a home operation of advancing and then retreating the hand H1 (or the hand H2) holding a substrate W, a receiving operation of receiving a substrate W from a predetermined position by the hand H1 (or the hand H2), a placing operation of placing a substrate W at a predetermined position by the hand H1 (or the hand H2) and an exchanging operation of receiving a substrate W from a predetermined position by the hand H1 (or the hand H2) and placing a substrate W at the predetermined position by the hand H2 (or the hand H1).

The movement speed of the hand H1, H2 differs in the home operation, the receiving operation, the placing operation and the exchanging operation. The movement speed of the hand H1, H2 is low in the home operation as compared to the receiving operation, the placing operation and the exchanging operation. As such, during the detection position calibrating operation, offsets may be respectively calculated by the home operation, the receiving operation, the placing operation and the exchanging operation, and the offsets relating to the detectors S1 to S6 and respectively corresponding to the home operation, the receiving operation, the placing operation and the exchanging operation may be stored. In this case, when the detection coordinates are corrected during the substrate transport operation, the offsets corresponding to the operation of the hand H1, H2 during calculation of the detection coordinates by the detectors S1 to S6 are used.

For example, in the case where the detection coordinates of the detectors S1 to S6 are calculated in the receiving operation of the substrate W by the hand H1 in the step S7 of FIG. 6, the offsets corresponding to the receiving operation are used in the correction of the detection coordinates in the step S10.

(10) Configuration and Operations of Substrate Processing Apparatus

Figure 10:
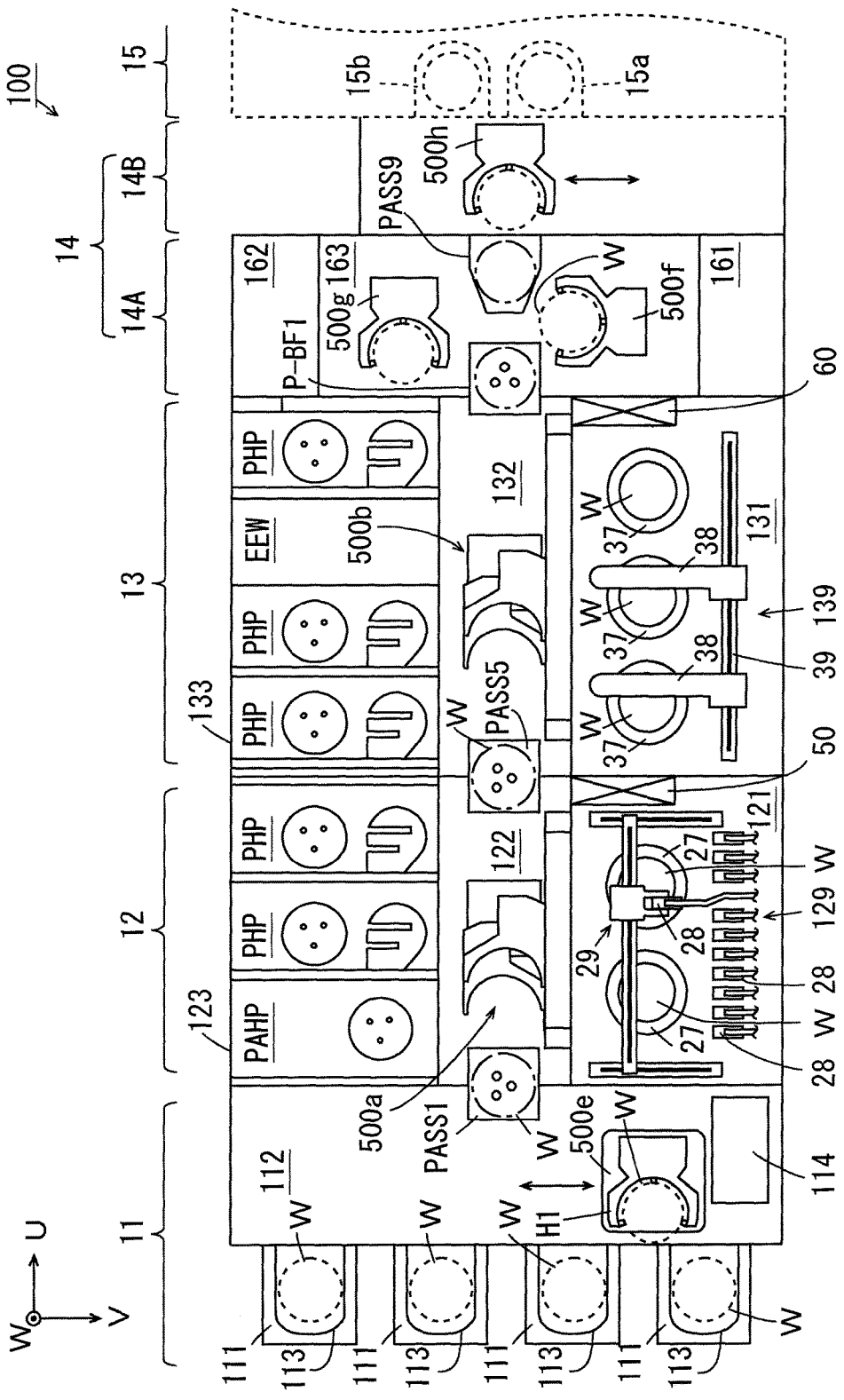
FIG. 10 is a schematic plan view of a substrate processing apparatus including the substrate transport device according to first or second embodiment.

FIG. 10 is a schematic plan view of the substrate processing apparatus including the substrate transport device according to the first or second embodiment. Each diagram of FIG. 10 and subsequent given diagrams are accompanied by arrows indicating a U direction, a V direction and a W direction orthogonal to each other for the clarity of a positional relationship. The U direction and the V direction are orthogonal to each other in a horizontal plane, and the W direction corresponds to a vertical direction.

As shown in FIG. 10, the substrate processing apparatus 100 includes an indexer block 11, a first processing block 12, a second processing block 13, a cleaning drying processing block 14A and a carry-in carry-out block 14B. An interface block 14 is constituted by a cleaning drying processing block 14A and a carry-in carry-out block 14B. An exposure device 15 is arranged to be adjacent to the carry-in carry-out block 14B. In the exposure device 15, exposure processing is performed on the substrate W by a liquid immersion method.

The indexer block 11 includes a plurality of carrier platforms 111 and a transport section 112. In each carrier platform 111, a carrier 113 for storing a plurality of substrates W in multiple stages is placed. In the transport section 112, a main controller 114 and a substrate transport device (indexer robot) 500e are provided. The main controller 114 controls various constituent elements of the substrate processing apparatus 100.

The first processing block 12 includes a coating processing section 121, a transport section 122 and a thermal processing section 123. The coating processing section 121 and the thermal processing section 123 are provided to be opposite to each other with the transport section 122 interposed therebetween. The second processing block 13 includes a coating development processing section 131, a transport section 132 and a thermal processing section 133. The coating development processing section 131 and the thermal processing section 133 are provided to be opposite to each other with the transport section 132 interposed therebetween.

The cleaning drying processing block 14A includes cleaning drying processing sections 161, 162 and a transport section 163. The cleaning drying processing sections 161, 162 are provided to be opposite to each other with the transport section 163 interposed therebetween. Substrate transport devices (transport robots) 500f, 500g are provided in the transport section 163. A substrate transport device 500h is provided in the carry-in carry-out block 14B. The substrate transport device 500h carries in the substrate W to and carries out the substrate W from the exposure device 15. In the exposure device 15, a substrate inlet 15a for carrying in the substrate W, and a substrate outlet 15b for carrying out the substrate W are provided.

Figure 11:
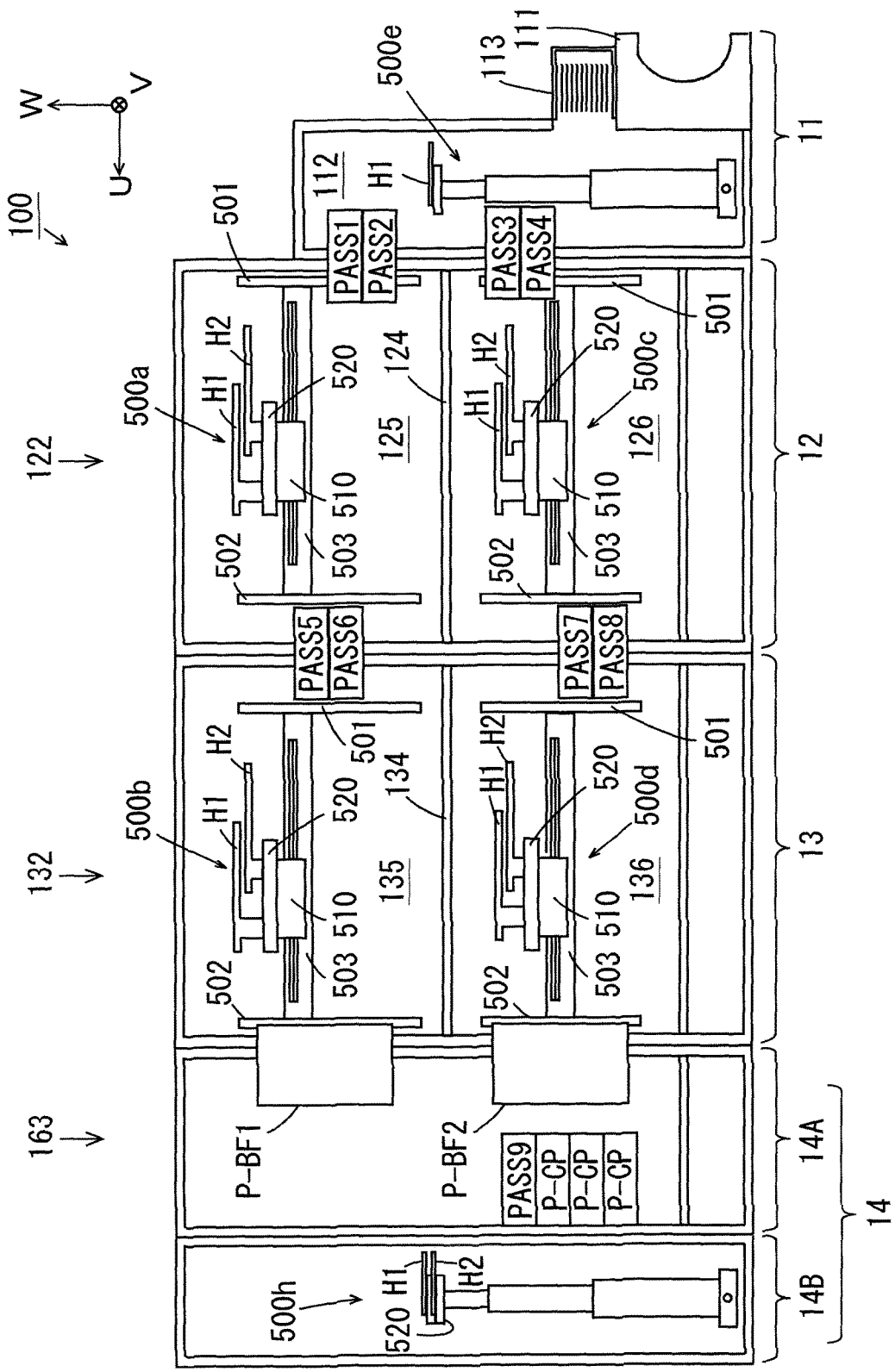
FIG. 11 is a side view mainly showing transport sections of FIG. 10.

FIG. 11 is a side view mainly showing the transport sections 122, 132, 163 of FIG. 10. As shown in FIG. 11, the transport section 122 has an upper transport chamber 125 and a lower transport chamber 126. The transport section 132 has an upper transport chamber 135 and a lower transport chamber 136. A substrate transport device (transport robot) 500a is provided in the upper transport chamber 125, and a substrate transport device 500c is provided in the lower transport chamber 126. Further, a substrate transport device 500b is provided in the upper transport chamber 135, and a substrate transport device 500d is provided in the lower transport chamber 136.

The substrate transport device 500a includes guide rails 501, 502, 503, the movement member 510, the rotation member 520 and the hands H1, H2. The guide rails 501, 502 are respectively provided to extend in the up-and-down direction. The guide rail 503 is provided to extend in the horizontal direction (U direction) between the guide rail 501 and the guide rail 502, and is attached to the guide rails 501, 502 to be movable in the up-and-down direction. The movement member 510 is attached to the guide rail 503 to be movable in the horizontal direction (U direction). A configuration of the substrate transport device 500b to 500d is similar to a configuration of the substrate transport device 500a.

The substrate transport device 500e of the transport section 112 has a hand H1 for holding a substrate W, and each of the substrate transport devices 500f, 500g of the transport section 163 of FIG. 10 and the substrate transport device 500h of FIG. 11 has hands H1, H2 for holding substrates W. The substrate transport device 500 according to the above-mentioned first or second embodiment is used as the substrate transport device 500a to 500h in the substrate processing apparatus 100 of FIGS. 10 and 11. Transport controllers 550 (FIG. 4) of the substrate transport devices 500a to 500h are integrally controlled by the main controller 114 during the substrate transport operation. Operation portions 529 (FIG. 4) of the substrate transport devices 500a to 500h may be a common operation panel provided in the substrate transport device 500.

Substrate platforms PASS1, PASS2 are provided between the transport section 112 and the upper transport chamber 125, and substrate platforms PASS3, PASS4 are provided between the transport section 112 and the lower transport chamber 126.

Substrate platforms PASS5, PASS6 are provided between the upper transport chamber 125 and the upper transport chamber 135, and substrate platforms PASS7, PASS8 are provided between the lower transport chamber 126 and the lower transport chamber 136.

A placement buffer unit P-BF1 is provided between the upper transport chamber 135 and the transport section 163, and a placement buffer unit P-BF2 is provided between the lower transport chamber 136 and the transport section 163. A substrate platform PASS9 and a plurality of placement cooling units P-CP are provided in the transport section 163 to be adjacent to the carry-in carry-out block 14B.

Figure 12:
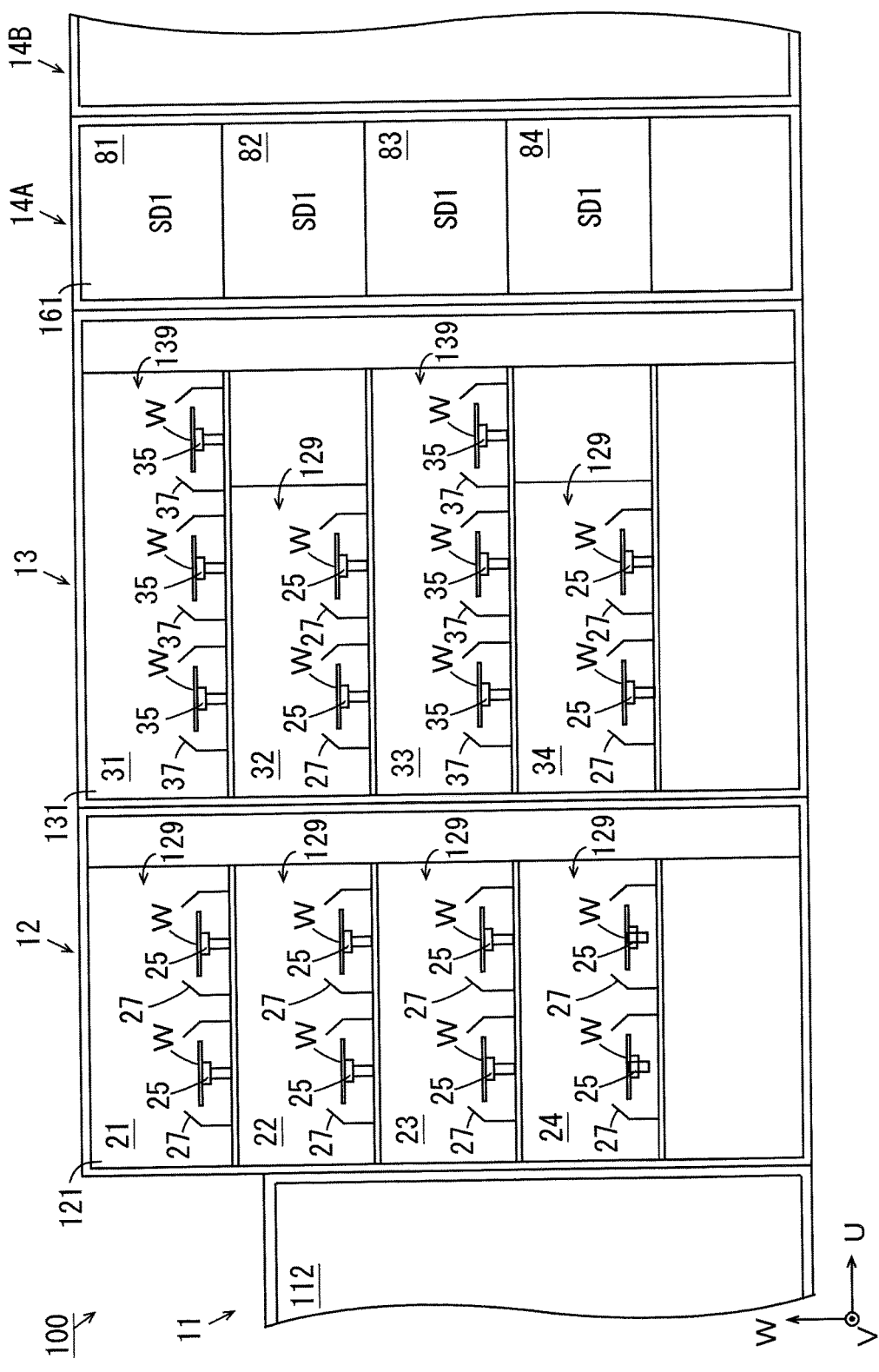
FIG. 12 is a schematic side view of the substrate processing apparatus mainly showing a coating processing section, a coating development processing section and a cleaning drying processing section of FIG. 10.

FIG. 12 is a schematic side view of the substrate processing apparatus 100 mainly showing the coating processing section 121, the coating development processing section 131 and the cleaning drying processing section 161 of FIG. 10.

As shown in FIG. 12, coating processing chambers 21, 22, 23, 24 are provided in a stack in the coating processing section 121. Each of the coating processing chambers 21 to 24 is provided with a coating processing unit (spin coater) 129. The coating development processing section 131 has development processing chambers 31, 33 and coating processing chambers 32, 34 provided in a stack. Each of the development processing chambers 31, 33 is provided with a development processing unit (spin developer) 139, and each of the coating processing chambers 32, 34 is provided with the coating processing unit 129.

Each coating processing unit 129 includes spin chucks 25 that hold the substrates W and cups 27 provided to cover the surroundings of the spin chucks 25. In the present embodiment, each coating processing unit 129 is provided with two pairs of the spin chuck 25 and the cup 27.

In the coating processing unit 129, each of the spin chucks 25 is rotated by a driving device (not shown), and any processing liquid nozzle 28 of a plurality of processing liquid nozzles 28 (FIG. 10) is moved to a position above the substrate W by a nozzle transport mechanism 29, and the processing liquid is discharged from the processing liquid nozzle 28. Thus, a processing liquid is applied onto the substrate W. Further, a rinse liquid is discharged to a peripheral portion of the substrate W from an edge rinse nozzle (not shown). Thus, the processing liquid adhering to the peripheral portion of the substrate W is removed.

In a coating processing unit 129 in a coating processing chamber 22, 24, a processing liquid for an anti-reflection film is supplied to the substrate W from a processing liquid nozzle 28. Thus, an anti-reflection film is formed on the substrate W. In a coating processing unit 129 in a coating processing chamber 21, 23, a processing liquid for a resist film is supplied to the substrate W from a processing liquid nozzle 28. Thus, a resist film is formed on the substrate W. In a coating processing unit 129 in a coating processing chamber 32, 34, a processing liquid for a resist cover film is supplied to the substrate W from a processing liquid nozzle 28. Thus, a resist cover film is formed on the substrate W.

Similarly to the coating processing unit 129, the development processing unit 139 includes spin chucks 35 and cups 37. Further, as shown in FIG. 10, the development processing unit 139 includes two development nozzles 38 that discharge a development liquid and a movement mechanism 39 that moves the development nozzles 38 in the X direction.

In the development processing unit 139, the spin chuck 35 is rotated by a driving device (not shown), and one development nozzle 38 supplies the development liquid to each substrate W while being moved in the U direction. Thereafter, the other development nozzle 38 supplies the development liquid to each substrate W while being moved. In this case, the development liquid is supplied to the substrate W, so that the development processing for the substrate W is performed.

In the cleaning drying processing section 161, cleaning drying processing chambers 81, 82, 83, 84 are provided in a stack. In each of the cleaning drying processing chambers 81 to 84, a cleaning drying processing unit SD1 is provided. In the cleaning drying processing unit SD1, the substrate W on which the exposure processing has not been performed is cleaned and dried.

FIG. 13 is a schematic side view of the substrate processing apparatus 100 mainly showing the thermal processing sections 123, 133 and the cleaning drying processing section 162 of FIG. 10. As shown in FIG. 13, the thermal processing section 123 has an upper thermal processing section 301 and a lower thermal processing section 302. A plurality of heating units PHP, a plurality of adhesion reinforcement processing units PAHP and a plurality of cooling units CP are provided in each of the upper thermal processing section 301 and the lower thermal processing section 302. Heating processing for the substrate W is performed in each heating unit PHP. In each adhesion reinforcement processing unit PAHP, adhesion reinforcement processing for improving adhesion between the substrate W and the anti-reflection film is performed. In each cooling unit CP, the cooling processing for the substrate W is performed.

The thermal processing section 133 has an upper thermal processing section 303 and a lower thermal processing section 304. A cooling unit CP, a plurality of heating units PHP and an edge exposure unit EEW are provided in each of the upper thermal processing section 303 and the lower thermal processing section 304. In the edge exposure unit EEW, exposure processing (edge exposure processing) is performed on a region having a constant width at the peripheral portion of the resist film formed on the substrate W. In each of the upper thermal processing section 303 and the lower thermal processing section 304, each heating unit PHP provided to be adjacent to the cleaning drying processing block 14A is configured to be capable of receiving the substrate W that is carried in from the cleaning drying processing block 14A.

In the cleaning drying processing section 162, cleaning drying processing chambers 91, 92, 93, 94, 95 are provided in a stack. In each of the cleaning drying processing chambers 91 to 95, a cleaning drying processing unit SD2 is provided. In the cleaning drying processing unit SD2, the substrate W on which the exposure processing has been performed is cleaned and dried.

The operations of the substrate processing apparatus 100 will be described with reference to FIGS. 10 to 13. First, the detection position calibrating operation is performed by the substrate transport devices 500a to 500h during manufacture or maintenance of the substrate processing apparatus 100. During an operation of the substrate processing apparatus 100, the substrate transport operation is performed by the substrate transport devices 500a to 500h.

Here, each of the substrate platforms PASS1 to PASS9, the placement cooling units P-CP, the coating processing units 129, the development processing units 139, the adhesion reinforcement processing units PAHP, the cooling units CP, the heating units PHP, the edge exposure units EEW and the cleaning drying processing units SD1, SD2 is referred to as a processing unit. Each processing unit has a supporter, and a reception position and a placement position are set in the supporter. For example, in each of the coating processing units 129, the development processing units 139, the edge exposure units EEW and the cleaning drying processing units SD1, SD2, a spin chuck is the supporter, and a reception position and a placement position are a rotational center of the spin chuck. In each of the substrate platforms PASS1 to PASS9, three support pins are supporters, and a reception position and a placement position are a center position among the three support pins. In each of the placement cooling units P-CP, the adhesion reinforcement processing units PAHP, the cooling units CP and the heating units PHP, a cooling plate or a heating plate is a supporter, and a reception position and a placement position are the center of an upper surface of the cooling plate or the heating plate.

In FIG. 11, during the substrate transport operation, the carrier 113 in which the unprocessed substrates W are stored is placed on the carrier platforms 111 (FIG. 10) in the indexer block 11. The substrate transport device 500e transports the unprocessed substrate W from the carrier 113 to the substrate platform PASS1, PASS3. Further, the substrate transport device 500e transports the processed substrate W that is placed on the substrate platform PASS2, PASS4 to the carrier 113.

In the first processing block 12, the substrate transport device 500a sequentially transports the substrate W placed on the substrate platform PASS1 to the adhesion reinforcement processing unit PAHP (FIG. 13), the cooling unit CP (FIG. 13) and the coating processing chamber 22 (FIG. 12). Next, the substrate transport device 500a sequentially transports the substrate W on which the anti-reflection film has been formed by the coating processing chamber 22 to the heating unit PHP (FIG. 13), the cooling unit CP (FIG. 13) and the coating processing chamber 21 (FIG. 12). Then, the substrate transport device 500a sequentially transports the substrate W on which the resist film has been formed by the coating processing chamber 21 to the heating unit PHP (FIG. 13) and the substrate platform PASS5. Further, the substrate transport device 500a transports the substrate W on which the development processing has been performed and which is placed on the substrate platform PASS6 to the substrate platform PASS2.

The substrate transport device 500c sequentially transports the substrate W placed on the substrate platform PASS3 to the adhesion reinforcement processing unit PAHP (FIG. 13), the cooling unit CP (FIG. 13) and the coating processing chamber 24 (FIG. 12). Then, the substrate transport device 500c sequentially transports the substrate W on which the anti-reflection film has been formed by the coating processing chamber 24 to the heating unit PHP (FIG. 13), the cooling unit CP (FIG. 13) and the coating processing chamber 23 (FIG. 12). Subsequently, the substrate transport device 500c sequentially transports the substrate W on which the resist film has been formed by the coating processing chamber 23 to the heating unit PHP (FIG. 13) and the substrate platform PASS7. Further, the substrate transport device 500c transports the substrate W on which the development processing has been performed and which is placed on the substrate platform PASS8 to the substrate platform PASS4.

In the second processing block 13, the substrate transport device 500b sequentially transports the substrate W on which the resist film has been formed and which is placed on the substrate platform PASS5 to the coating processing chamber 32 (FIG. 12), the heating unit PHP (FIG. 13), the edge exposure unit EEW (FIG. 13) and the placement buffer unit P-BF1. Further, the substrate transport device 500b takes out the substrate W on which the exposure processing has been performed by the exposure device 15 and on which the thermal processing has been performed from the heating unit PHP (FIG. 13) adjacent to the cleaning drying processing block 14A. The substrate transport device 500b sequentially transports the substrate W to the cooling unit CP (FIG. 13), the development processing chamber 31 (FIG. 12), the heating unit PHP (FIG. 13) and the substrate platform PASSE.

The substrate transport device 500d sequentially transports the substrate W on which the resist film has been formed and which is placed on the substrate platform PASS7 to the coating processing chamber 34 (FIG. 12), the heating unit PHP (FIG. 13), the edge exposure unit EEW (FIG. 13) and the placement buffer unit P-BF2. Further, the substrate transport device 500d takes out the substrate W on which the exposure processing has been performed by the exposure device 15 and on which the thermal processing has been performed from the heating unit PHP (FIG. 13) adjacent to the cleaning drying processing block 14A. The substrate transport device 500d sequentially transports the substrate W to the cooling unit CP (FIG. 13), the development processing chamber 33 (FIG. 12), the heating unit PHP (FIG. 13) and the substrate platform PASS8.

In the cleaning drying processing block 14A of FIG. 10, the substrate transport device 500f transports the substrate W that is placed on the placement buffer unit P-BF1, P-BF2 (FIG. 11) to the cleaning drying processing unit SD1 (FIG. 12) in the cleaning drying processing section 161. Subsequently, the substrate transport device 500f transports the substrate W from the cleaning drying processing unit SD1 to the placement cooling unit P-CP (FIG. 11). The substrate transport device 500g of FIG. 10 transports the substrate W on which the exposure processing has been performed and which is placed on the substrate platform PASS9 (FIG. 11) to the cleaning drying processing unit SD2 (FIG. 12) in the cleaning drying processing section 162. Further, the substrate transport device 500g transports the substrate W, which has been cleaned and dried, from the cleaning drying processing unit SD2 to the heating unit PHP (FIG. 13) in the upper thermal processing section 303 or the heating unit PHP (FIG. 13) in the lower thermal processing section 304.

In the carry-in carry-out block 14B of FIG. 11, the substrate transport device 500h transports the substrate W on which the exposure processing has not been performed and which is placed on the placement cooling unit P-CP to the substrate inlet 15a (FIG. 10) of the exposure device 15. Further, the substrate transport device 500h takes out the substrate W on which the exposure processing has been performed from the substrate outlet 15b (FIG. 10) of the exposure device 15 and transports the substrate W to the substrate platform PASS9.

In the substrate processing apparatus 100, even in the case where there are deviations between the design positions and the actual positions of the plurality of detectors S1 to S6 of each substrate transport device 500a to 500h, a position of the substrate W on the hand H1, H2 can be accurately detected based on the offsets calculated by the detection position calibrating operation. Thus, the substrate W can be accurately transported from the reception position to the placement position. Therefore, transport accuracy of the substrate W can be improved.

(11) Other Embodiments (a) In the above-mentioned embodiment, each hand of the substrate transport device 500 may have a mechanism for holding an outer peripheral end of a substrate by abutting against the outer peripheral end of the substrate instead of a mechanism for sucking a back surface of the substrate. In the hand that holds the outer peripheral end of the substrate, a portion abutting against the outer peripheral end of the substrate wears, so that the substrate may be held by the hand while deviating from the reference position. In this case, the substrate may be placed at a position deviating from a position at which the substrate is to be placed originally. Even in such a case, the position of the substrate held by the hand can be accurately detected based on the offsets calculated by the detection position calibrating operation. As a result, the substrate can be accurately placed at the position at which the substrate is to be placed originally.

(b) While the six detectors S1 to S6 are used in the above-mentioned embodiments, the number of detectors is not limited to six. A different number of a plurality of detectors may be used. Three or more than three detectors are preferably used. In the case where a substrate has a notch, four or more than four detectors are preferably used.

(c) While the light emitters Se of the plurality of detectors S1 to S6 emit light upwardly of the substrate from a position below the substrate in the above-mentioned embodiment, the present invention is not limited to this. The light emitters Se of the plurality of detectors S1 to S6 may emit light downwardly of the substrate from a position above the substrate.

(d) In the above-mentioned embodiment, the light receivers Sr of the plurality of detectors S1 to S6 are arranged to receive transmission light, which is emitted from the plurality of light emitters Se and passes through a movement path of the substrate, as returning light. However, the invention is not limited to this. The plurality of light receivers Sr may be arranged to receive the light, which is emitted from the plurality of light emitters Se and reflected from the movement path of the substrate, as returning light.

(e) While the plurality of portions in the outer periphery of the substrate held by the hand are detected by the optical-type detectors S1 to S6 in the above-mentioned embodiment, the invention is not limited to this. The plurality of portions in the outer periphery of the substrate held by the hand may be detected by a plurality of other detectors such as ultrasonic sensors.

(12) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the rotation member 520 is an example of a movable element, the up-and-down direction driving motor 511, the horizontal direction driving motor 513, the rotation direction driving motor 515 and the movement member 510 are examples of a first driver, the hands H1, H2 are examples of a holder, the upper hand advancing retreating driving motor 525 or the lower hand advancing retreating driving motor 527 is an example of a second driver and the detectors S1 to S6 are examples of a plurality of detectors. The detection coordinate calculator 51, the offset calculator 52 and the movement controller 56 are examples of a deviation amount calculator, the detection coordinate calculator 51 and the detection coordinate corrector 55 are examples of a position detector, the movement controller 56 is an example of a movement controller, the coordinate information storage 57 is an example of a storage, the coordinate information corrector 58 is an example of a control information corrector and the coordinate information is an example of control information. The advancing retreating direction or the Y axis direction of the hand H1, H2 is an example of a first direction, the left-and-right direction or the X axis direction of the hand H1, H2 is an example of a second direction, the left position or the right position in the hand H1, H2 is an example of a first position, the right position or the left position in the hand H1, H2 is an example of a second position, the offsets Yoff1 to Yoff6 are examples of a first offset, the offsets Xoff1 to Xoff6 are examples of a second offset, the guide jigs 541, 542 are examples of an abutment member and the guide jigs 54a, 54b are examples of first and second abutment members.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A substrate transport device that transports a substrate, comprising:
   a movable element;
   a first driver that moves the movable element;
   a holder that is configured to hold the substrate;
   a second driver that moves the holder in a first direction with respect to the movable element;
   a plurality of detectors that are provided to respectively detect a plurality of portions in an outer periphery of the substrate moved by the holder; and
   a transport controller that controls the first and second drivers, wherein the transport controller includes
a deviation amount calculator that, during a detection position calibrating operation, moves the holder with respect to the movable element by the second driver, and calculates deviation amounts respectively between design positions of the plurality of detectors and actual positions of the plurality of detectors based on output signals of the plurality of detectors,
a position detector that, during a substrate transport operation, detects a position of the substrate in the holder based on the output signals of the plurality of detectors and the deviation amounts calculated by the deviation amount calculator, and
a movement controller that controls the first and second drivers based on the position detected by the position detector.

2. The substrate transport device according to claim 1, wherein
the deviation amounts include first offsets indicating deviation amounts between the design positions of the plurality of detectors and the actual positions of the plurality of detectors in the first direction.

3. The substrate transport device according to claim 2, wherein
the holder is configured to have a predetermined reference position, and hold a reference substrate at the reference position during the detection position calibrating operation, and
the deviation amount calculator, during the detection position calibrating operation, moves the holder holding the reference substrate at the reference position and calculates the first offsets based on the output signals of the plurality of detectors.

4. The substrate transport device according to claim 3, further comprising an abutment member attachable to the holder during the detection position calibrating operation, wherein
the reference substrate is positioned at the reference position by abutting against the abutment member.

5. The substrate transport device according to claim 2, wherein
the deviation amounts further include second offsets indicating deviation amounts between the design positions of the plurality of detectors and the actual positions of the plurality of detectors in a second direction intersecting with the first direction.

6. The substrate transport device according to claim 5, wherein
the holder is configured to hold a reference substrate at first and second positions that are different from each other in the second direction during the detection position calibrating operation, and
the deviation amount calculator, during the detection position calibrating operation, moves the holder holding the reference substrate at the first position, moves the holder holding the reference substrate at the second position, and calculates the first and second offsets based on the output signals of the plurality of detectors that are output when the holder holding the reference substrate at the first position moves and the output signals of the plurality of detectors that are output when the holder holding the reference substrate at the second position moves.

7. The substrate transport device according to claim 6, further comprising first and second abutment members attachable to the holder during the detection position calibrating operation, wherein the first and second abutment members have sizes different from each other, and
the first and second abutment members are attached to first and second portions of the holder respectively and the reference substrate abuts against the first and second abutment members to position the reference substrate at the first position, and the first and second abutment members are attached to the second and first portions of the holder respectively and the reference substrate abuts against the first and second abutment members to position the reference substrate at the second position.

8. The substrate transport device according to claim 1, wherein
the deviation amount calculator calculates deviation amounts depending on a movement speed of the holder during the detection position calibrating operation.

9. The substrate transport device according to claim 1, wherein
the transport controller further includes
a storage that stores control information for controlling the movement controller such that the holder places the substrate at a predetermined position, and
a control information corrector that, during the substrate transport operation, corrects the control information based on the position detected by the position detector such that a deviation between a position at which the substrate is to be placed by the holder and the predetermined position is cancelled before the holder places the substrate at the predetermined position, and
the movement controller controls the first and second drivers based on the corrected control information.

10. A detection position calibration method for calibrating a position of a substrate detected by a plurality of detectors provided in a substrate transport device,
the substrate transport device comprising:
a movable element;
a first driver that moves the movable element;
a holder that is configured to hold the substrate;
a second driver that moves the holder in a first direction with respect to the movable element; and
a plurality of detectors that are provided to respectively detect a plurality of portions in an outer periphery of the substrate moved by the holder, and
the detection position calibration method including the steps of:
during a detection position calibrating operation, moving the holder with respect to the movable element by the second driver and calculating deviation amounts respectively between design positions of the plurality of detectors and actual positions of the plurality of detectors based on output signals of the plurality of detectors, and
during a substrate transport operation, detecting a position of the substrate in the holder based on output signals of the plurality of detectors and the calculated deviation amounts.

11. A substrate processing apparatus that performs processing on a substrate, comprising:
a processing unit that is configured to have a supporter supporting the substrate and perform processing on the substrate supported by the supporter; and
the substrate transport device according to claim 1, wherein the movement controller of the substrate transport device transports the substrate to a predetermined position in the supporter of the processing unit by controlling the first and second drivers.

\* \* \* \* \*